US010504476B2

(12) United States Patent
Kang et al.

(10) Patent No.: US 10,504,476 B2
(45) Date of Patent: Dec. 10, 2019

(54) GATE DRIVER OF DISPLAY DEVICE

(71) Applicant: SAMSUNG DISPLAY CO., LTD., Yongin-si, Gyeonggi-do (KR)

(72) Inventors: Shintack Kang, Yongin-si (KR); Duchan Cho, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 169 days.

(21) Appl. No.: 15/672,796

(22) Filed: Aug. 9, 2017

(65) Prior Publication Data
US 2018/0047366 A1    Feb. 15, 2018

(30) Foreign Application Priority Data

Aug. 10, 2016    (KR) .................. 10-2016-0101911

(51) Int. Cl.
| G11C 19/00 | (2006.01) |
| G09G 3/36 | (2006.01) |
| G09G 3/3225 | (2016.01) |
| G11C 19/28 | (2006.01) |

(52) U.S. Cl.
CPC ......... G09G 3/3696 (2013.01); G09G 3/3225 (2013.01); G09G 3/3677 (2013.01); G09G 2300/0861 (2013.01); G09G 2310/0286 (2013.01); G11C 19/28 (2013.01)

(58) Field of Classification Search
None
See application file for complete search history.

(56) References Cited

U.S. PATENT DOCUMENTS

| 9,293,222 | B2 | 3/2016 | Jang et al. |
| 9,754,551 | B2* | 9/2017 | Jeoung .................. G09G 5/003 |
| 2005/0128169 | A1 | 6/2005 | Kang et al. |
| 2006/0262071 | A1 | 11/2006 | Shieh et al. |
| 2008/0001904 | A1* | 1/2008 | Kim ..................... G09G 3/3677 345/100 |
| 2008/0186421 | A1 | 8/2008 | Park |
| 2009/0303225 | A1 | 12/2009 | Kang et al. |
| 2010/0097368 | A1* | 4/2010 | Hwang ................ G09G 3/3677 345/213 |

(Continued)

FOREIGN PATENT DOCUMENTS

| KR | 1020130110306 A | 10/2013 |
| KR | 1020140148021 A | 12/2014 |
| KR | 1020160009845 A | 1/2016 |

Primary Examiner — Tuan T Lam
(74) Attorney, Agent, or Firm — Cantor Colburn LLP

(57) ABSTRACT

A gate driver includes a stage including a first switching element connected between one of a high voltage input terminal and a set control terminal of the stage and a set node of the stage, a gate electrode connected to the set control terminal of the stage, a second switching element connected between the set node and an off voltage input terminal of the stage, and including a gate electrode connected to a reset control terminal of the stage, a third switching element connected between the set node and the off voltage input terminal, and including a gate electrode connected to the reset node, an output switching element connected between an output terminal of the stage and a clock input terminal of the stage, and including a gate electrode connected to the set node, capacitors connected between the clock input terminal and the reset node, and a fourth switching element.

18 Claims, 18 Drawing Sheets

(56) References Cited

U.S. PATENT DOCUMENTS

| | | | |
|---|---|---|---|
| 2010/0207928 A1* | 8/2010 | Lee | G09G 3/3677 345/213 |
| 2010/0277206 A1* | 11/2010 | Lee | G09G 3/3677 327/108 |
| 2010/0309236 A1 | 12/2010 | Min et al. | |
| 2011/0069044 A1* | 3/2011 | Lee | G11C 19/28 345/204 |
| 2011/0157263 A1* | 6/2011 | Kim | G09G 3/3677 345/698 |
| 2013/0181747 A1* | 7/2013 | Yoon | G11C 19/184 327/108 |
| 2013/0300775 A1* | 11/2013 | Choi | G02B 26/005 345/690 |
| 2014/0055436 A1* | 2/2014 | Han | G09G 3/3696 345/211 |
| 2015/0042689 A1* | 2/2015 | Kim | H03K 3/012 345/690 |

\* cited by examiner

GATE DRIVER OF DISPLAY DEVICE

This application claims priority to Korean Patent Application No. 10-2016-0101911, filed on Aug. 10, 2016, and all the benefits accruing therefrom under 35 U.S.C. § 119, the content of which in its entirety is herein incorporated by reference.

FIELD

Exemplary embodiments of the invention relate to a gate driver, and more particularly, to a gate driver of a display device capable of stably generating an output.

DESCRIPTION OF THE RELATED ART

A conventional liquid crystal display ("LCD") device displays an image by adjusting a light transmittance of liquid crystals using an electric field. To this end, an LCD device includes a display panel in which pixel areas are arranged in a matrix form, and a driving circuit for driving the display panel.

The display panel includes a plurality of gate lines and a plurality of data lines. The plurality of gate lines are respectively driven by a plurality of gate signals, which are generated by a gate driver.

The gate driver includes a shift register outputting the gate signals, and the shift register includes a plurality of stages for outputting the plurality of gate signals.

SUMMARY

Each of a plurality of stages is desired to be in a reset state until a subsequent frame period after outputting a gate signal, which allows normal output of the gate driver. However, when a voltage accumulated in a node inside the stage is not normally discharged, a multi-output phenomenon may occur in which two or more gate signals are output from the stage for one frame period.

Exemplary embodiments of the invention may be directed to a gate driver of a display device capable of generating a stable output.

According to an exemplary embodiment, a gate driver of a display device includes a stage for driving a gate line of a display panel. The stage incluedes a first switching element connected between one of a high voltage input terminal and a set control terminal of the stage and a set node of the stage, and including a gate electrode connected to the set control terminal of the stage, a second switching element connected between the set node and an off voltage input terminal of the stage, and including a gate electrode connected to a reset control terminal of the stage, a third switching element connected between the set node and the off voltage input terminal, and including a gate electrode connected to the reset node, an output switching element connected between an output terminal of the stage and a clock input terminal of the stage, and including a gate electrode connected to the set node, a plurality of capacitors connected between the clock input terminal and the reset node, and a fourth switching element connected between a node between the plurality of capacitors and a direct current ("DC") voltage input terminal to which a DC voltage is applied, and including a gate electrode connected to the output terminal.

In an exemplary embodiment, the DC voltage input terminal and the off voltage input terminal may be substantially the same.

In an exemplary embodiment, the stage may further include a fifth switching element connected between the DC voltage input terminal and a node between the plurality of capacitors, and including a gate electrode connected to the reset control terminal.

In an exemplary embodiment, the node between the plurality of capacitors to which the fourth switching element is connected may be substantially the same as the node between the plurality of capacitors to which the fifth switching element is connected.

In an exemplary embodiment, the node between the plurality of capacitors to which the fourth switching element is connected may be different from the node between the plurality of capacitors to which the fifth switching element is connected.

In an exemplary embodiment, the output terminal includes a gate output terminal through which a gate signal of the stage is output, and a carry output terminal through which a carry signal of the stage is output.

In an exemplary embodiment, the gate electrode of the fourth switching element may be connected to either the gate output terminal or the carry output terminal.

In an exemplary embodiment, the off voltage input terminal may include a first off voltage input terminal to which a first low voltage is applied, and a second off voltage input terminal to which a second low voltage is applied, the second low voltage being less than the first low voltage.

In an exemplary embodiment, the fourth switching element may be connected to either the first off voltage input terminal or the second off voltage input terminal.

In an exemplary embodiment, the output switching element may include a gate output switching element connected between the clock input terminal and the gate output terminal, and including a gate electrode connected to the set node, and a carry output switching element connected between the clock input terminal and the carry output terminal which includes a gate electrode connected to the set node.

In an exemplary embodiment, the stage may further include an output discharge switching element connected between the output terminal and the off voltage input terminal, and including a gate electrode connected to the reset node.

In an exemplary embodiment, the off voltage input terminal may include a first off voltage input terminal to which a first low voltage is applied, and a second off voltage input terminal to which a second low voltage is applied, the second low voltage being less than the first low voltage. The output discharge switching element may include a first gate discharge switching element connected between the gate output terminal and the first off voltage input terminal, and including a gate electrode connected to the reset node, and a first carry discharge switching element connected between the carry output terminal and the second off voltage input terminal, and including a gate electrode connected to the reset node.

In an exemplary embodiment, the output discharge switching element may further include a second gate discharge switching element connected between the gate output terminal and the first off voltage input terminal, and including a gate electrode connected to the reset control terminal, and a second carry discharge switching element connected between the carry output terminal and the second off voltage input terminal, and including a gate electrode connected to the reset control terminal.

In an exemplary embodiment, the stage may further include at least one of a sixth switching element connected between the set node and the off voltage input terminal, the sixth switching element including a gate electrode connected to a common reset control terminal of the stage, and connected between the gate output terminal and the off voltage input terminal, the seventh switching element including a gate electrode connected to the common reset control terminal, and an eighth switching element connected between the carry output terminal and the off voltage input terminal, and including a gate electrode connected to the common reset control terminal.

In an exemplary embodiment, the stage may further include an inverter unit controlling a signal of the reset node based on a signal of the clock input terminal and a signal of the output terminal.

In an exemplary embodiment, the inverter unit may include a ninth switching element connected between the clock input terminal and the reset node, the ninth switching element including a gate electrode, a tenth switching element connected between the clock input terminal and the gate electrode of the ninth switching element, the tenth switching element including a gate electrode connected to the clock input terminal, an eleventh switching element connected between the gate electrode of the ninth switching element and the off voltage input terminal, the eleventh switching element including a gate electrode connected to the output terminal, and a twelfth switching element connected between the reset node and the off voltage input terminal, the twelfth switching element including a gate electrode connected to the output terminal.

In an exemplary embodiment, the gate driver of a display device may further include a previous stage outputting at least one of a gate signal and a carry signal prior to the stage during one frame period and applying one of the gate signal and the carry signal to the set control terminal of the stage.

In an exemplary embodiment, the gate driver of a display device may further include a subsequent stage outputting at least one of a gate signal and a carry signal subsequent to the stage during one frame period and applying one of the gate signal and the carry signal to the reset control terminal of the stage.

The foregoing is illustrative only and is not intended to be in any way limiting. In addition to the illustrative exemplary embodiments, and features described above, further exemplary embodiments, and features will become apparent by reference to the drawings and the following detailed description.

BRIEF DESCRIPTION OF THE DRAWINGS

A more complete appreciation of the invention will become more apparent by describing in detail exemplary embodiments thereof with reference to the accompanying drawings, in which.

DETAILED DESCRIPTION

Figure 1:
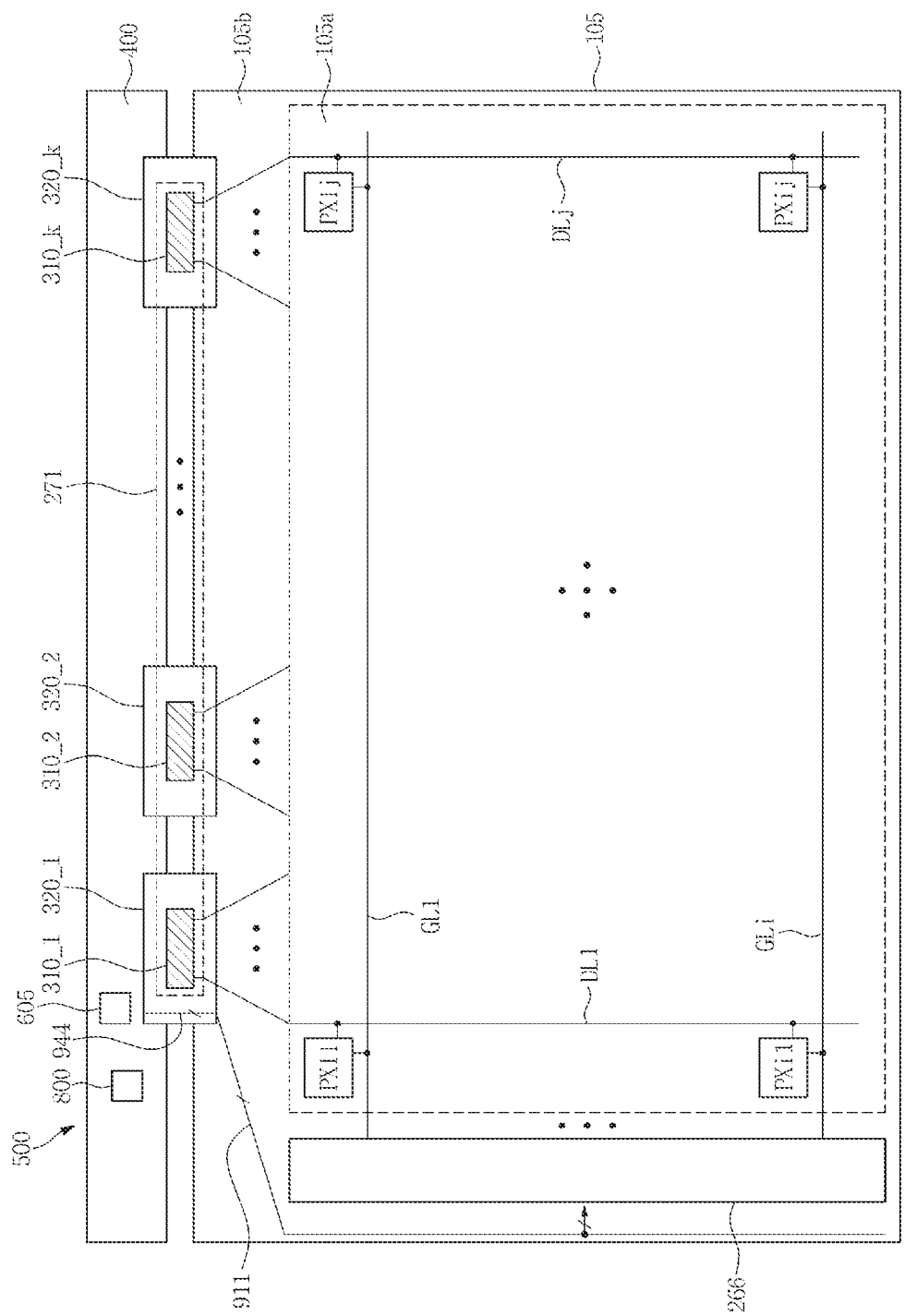
FIG. 1 is a plan view illustrating an exemplary embodiment of a display device including a gate driver.

Exemplary embodiments will now be described more fully hereinafter with reference to the accompanying drawings. Although the invention may be modified in various manners and have several exemplary embodiments, exemplary embodiments are illustrated in the accompanying drawings and will be mainly described in the specification. However, the scope of the invention is not limited to the exemplary embodiments and should be construed as including all the changes, equivalents, and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Some of the parts which are not associated with the description may not be provided in order to specifically describe exemplary embodiments of the invention, and like reference numerals refer to like elements throughout the specification.

Hereinafter, a gate driver of a display device according to an exemplary embodiment will be described in detail with reference to FIGS. 1 to 14B.

FIG. 1 is a plan view illustrating a display device including a gate driver according to an exemplary embodiment.

As illustrated in FIG. 1, a display device 500 according to an exemplary embodiment includes a display panel 105, a data driver 271, a gate driver 266, a circuit board 400, a power supply 605 and a timing controller 800.

The timing controller 800 and the power supply 605 are located on the circuit board 400.

In an exemplary embodiment, the timing controller 800 receives a vertical synchronization signal, a horizontal synchronization signal, an image data signal and a reference clock signal, for example, output from a graphic controller (not illustrated) provided in a system (not illustrated).

An interface circuit (not illustrated) is provided between the timing controller 800 and the system, and the above signals output from the system are input to the timing controller 800 through the interface circuit. The interface circuit may be embedded in the timing controller 800.

The timing controller 800 generates a gate control signal for controlling the gate driver 266 and a data control signal for controlling the data driver 271, using the vertical synchronization signal, the horizontal synchronization signal and the reference clock signal.

In an exemplary embodiment, the gate control signal may include clock signals, a vertical start signal and a common reset control signal, for example.

In an exemplary embodiment, the data control signal includes a source start pulse, a source shift clock, a source output enable signal, a polarity inversion control signal ("POL"), or the like, for example.

In addition, the timing controller 800 rearranges the image data signals input through the system, and applies the rearranged image data signals to the data driver 271.

The display panel 105 is divided into a display area 105a and a non-display area 105b.

In an exemplary embodiment, the display panel 105 may be a panel used in various kinds of display devices such as a liquid crystal display ("LCD") panel or an organic light emitting diode ("OLED") panel.

The display panel 105 includes a plurality of data lines DL1 to DLj, a plurality of gate lines GL1 to GLi and a plurality of pixels PX11 to PXij. Herein, i and j are natural numbers larger than 1.

The data lines DL1 to DLj cross the gate lines GL1 to GLi. The data lines DL1 to DLj extend to the non-display area 105b and are connected to the data driver 271.

The data driver 271 includes a plurality of data driving integrated circuits ("ICs") 310_1, 310_2, . . . , 310_k. The data driving ICs 310_1, 310_2, . . . 310_k receive digital image data signals and a data control signal from the timing controller 800.

The data driving ICs 310_1, 310_2, . . . 310_k sample the digital image data signals according to the data control signal, latch the sampling image data signals corresponding to one horizontal line in each horizontal period, and apply the latched image data signals to the data lines DL1 to DLj. In an exemplary embodiment, the data driving ICs 310_1, 310_2, . . . 310_k may convert the digital image data signals from the timing controller 800 into analog image signals using a gamma voltage input from the power supply 605 and apply the analog image signals to the data lines DL1 to DLj, for example.

The data driving ICs 310_1, 310_2, . . . , and 310_k are disposed (e.g., mounted) on data carriers 320_1, 320_2, . . . , and 320_k, respectively. The data carriers 320_1, 320_2, . . . , and 320_k are connected between the circuit board 400 and the display panel 105. In an exemplary embodiment, each of the data carriers 320_1, 320_2, . . . , and 320_k is electrically connected between the circuit board 400 and the non-display area 105b of the display panel 105, for example.

The data carriers 320_1, 320_2, . . . , and 320_k include input wirings which transmit various signals applied from the timing controller 800 and the power apply 605 to the data driving ICs 310_1, 310_2, . . . , and 310_k, and output wirings which transmit the image data signals output from the data driving ICs 310_1, 310_2, . . . , and 310_k to the corresponding data lines DL1 to DLj, respectively. In an exemplary embodiment, at least one carrier 320_1 may further include auxiliary wirings 944 which transmit various signals applied from the timing controller and the power apply 605 to the gate driver 266, and the auxiliary wirings 944 are connected to panel wirings 911 on the display panel 105. The panel wirings 911 connect the auxiliary wirings 944 and the gate driver 266. In an exemplary embodiment, the panel wirings 911 may be disposed in the non-display area 105b of the display panel 105 in a line-on-glass manner, for example.

The pixels PX11 to PXij are disposed in the display area 105a of the display panel 105. The pixels PX11 to PXij are arranged in a matrix form. In an exemplary embodiment, the pixels PX11 to PXij may include a red pixel displaying a red image, a green pixel displaying a green pixel and a blue pixel displaying a blue pixel, for example. In the exemplary embodiment, the red pixel, the green pixel and the blue pixel that are adjacently disposed in a horizontal direction may form a unit pixel for displaying a unit image. However, the invention is not limited thereto, and the pixels PX11 to PXij may include various other color pixels.

There are "j" number of pixels arranged along a p-th (p is a number selected from 1 to i) horizontal line (hereinafter, p-th horizontal line pixels) connected to the first to j-th data lines DL1 to DLj, respectively. Further, the p-th horizontal line pixels may be connected to a p-th gate line together. Accordingly, the p-th horizontal line pixels receive a p-th gate signal as a common signal. That is, "j" number of pixels arranged in a same horizontal line receives a same gate signal, while pixels arranged in different horizontal lines receive different gate signals, respectively. Herein, "p" is a natural number equal to or larger than 1 and equal to or less than "i."

Each pixel, although not illustrated, includes a pixel transistor, a liquid crystal capacitor and a storage capacitor. In an exemplary embodiment, the pixel transistor may be a thin film transistor ("TFT"). However, the invention is not limited thereto, and the pixel transistor may include various other types of transistors.

The pixel transistor is turned on according to a gate signal applied from the gate line. The turned-on pixel transistor applies an analog image data signal applied from the data line to the liquid crystal capacitor and the storage capacitor.

The liquid crystal capacitor includes a pixel electrode and a common electrode opposing each other.

The storage capacitor includes a pixel electrode and an opposing electrode opposing each other. Herein, the opposing electrode may be a previous gate line or a transmission line that transmits a common voltage, for example.

Figure 2:
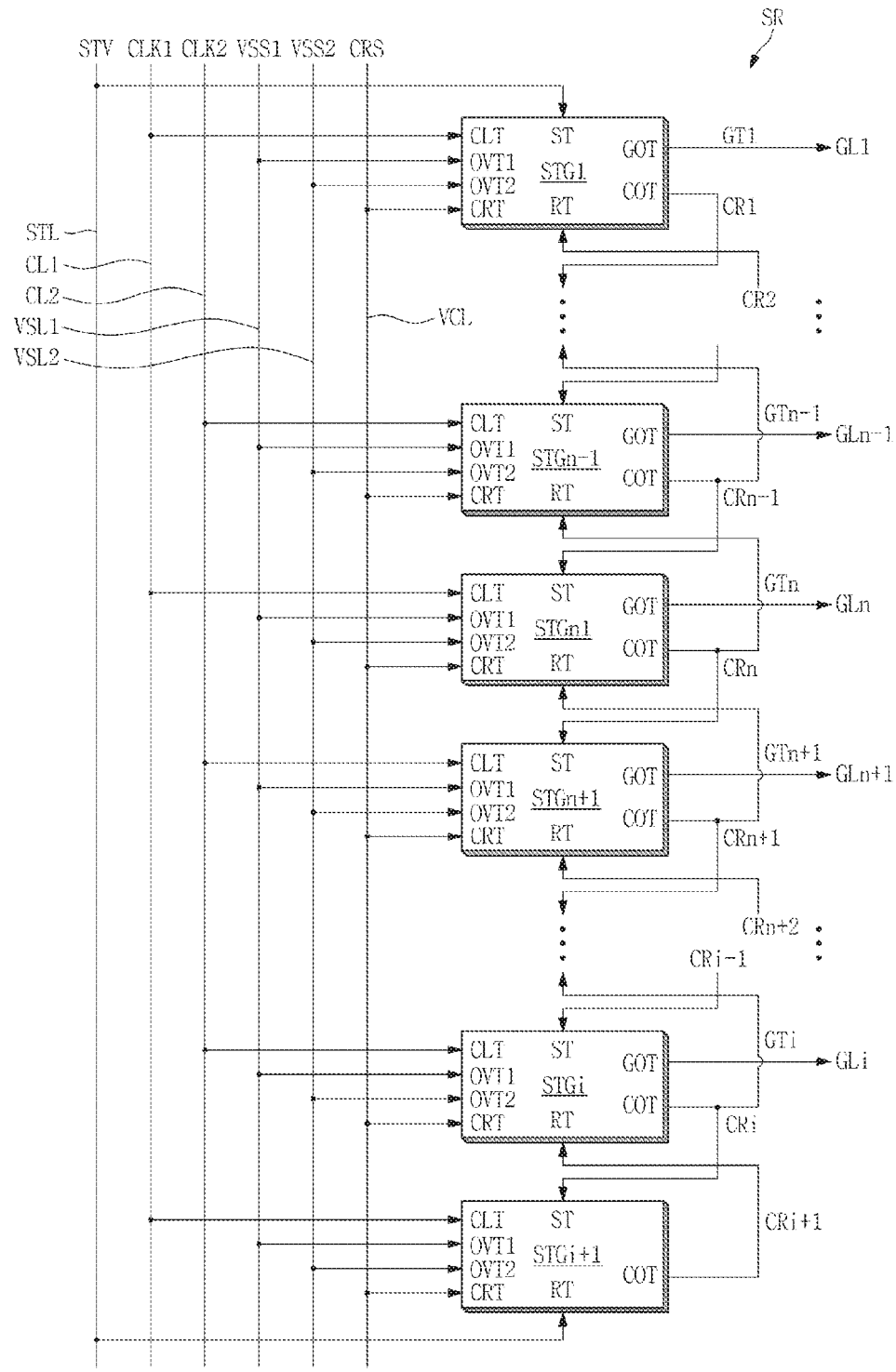
FIG. 2 is a block diagram illustrating a shift register included in the gate driver of FIG. 1.

The gate lines GL1 to GLi are operated by the gate driver 266, and the gate driver 266 includes a shift register SR (refer to FIG. 2).

The clock signals applied from the timing control unit 800 and off voltages applied from the power supply 605 are applied to the shift register SR of the gate driver 266 through the auxiliary wirings 944 and the panel wirings 911.

Figure 3:
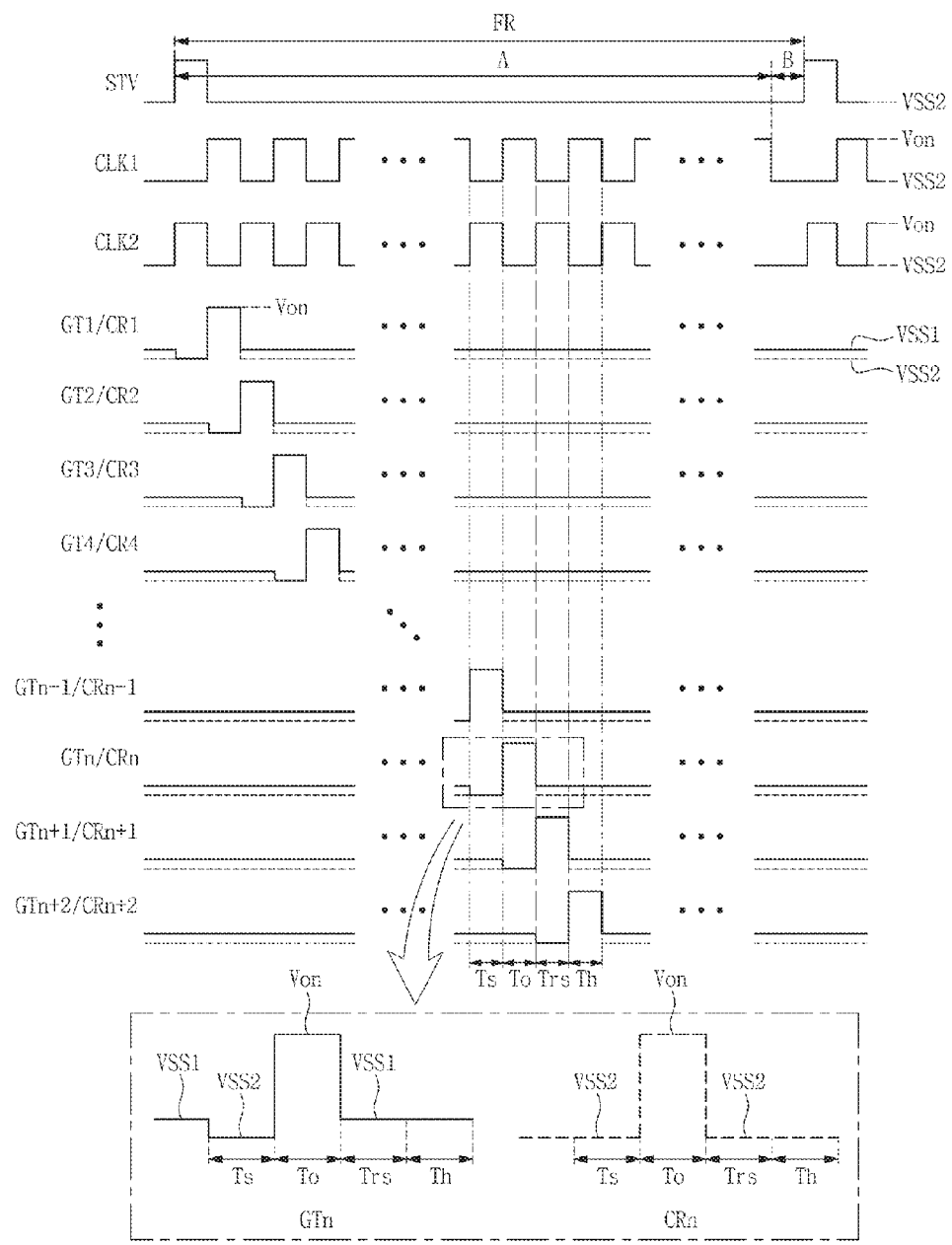
FIG. 3 is a diagram illustrating waveforms of various signals applied to the shift register of FIG. 2 and signals output from the shift register.

FIG. 2 is a block diagram illustrating a shift register SR included in the gate driver 266 of FIG. 1, and FIG. 3 is a view illustrating waveforms of various signals applied to the shift register SR of FIG. 2 and signals output from the shift register SR.

The shift register SR, as illustrated in FIG. 2, includes first to i-th stages STG1, STGn−1, STGn, STGn+1, . . . , and STGi and a dummy stage STGi+1.

The aforementioned panel wirings 911 (refer to FIG. 1) include a vertical line STL, a first clock line CL1, a second clock line CL2, a first off line VSL1, a second off line VSL2 and a control line VCL.

The first to i-th stages STG1 to STGi are connected to the first to i-th gate lines GL1 to GLi in one to one correspondence. In an exemplary embodiment, as illustrated in FIG. 2, the n-th stage STGn is connected to the n-th gate line GLn, for example.

The respective stages STG1 to STGi drive corresponding ones of the gate lines GL1 to GLi connected thereto. In an exemplary embodiment, the n-th stage STGn applies an n-th gate signal GTn to the n-th gate line GLn to drive the n-th gate line GLn, for example.

The dummy stage STGi+1 outputs a dummy carry signal CRi+1 for resetting the i-th stage STGi. In other exemplary embodiments, two or more dummy stages may be provided.

Each of the stages STG1 to STGi includes a set control terminal ST, a reset control terminal RT, a gate output terminal GOT, a carry output terminal COT, a clock input terminal CLT, a first off-voltage input terminal OVT1, a second off-voltage input terminal OVT2, and a control terminal CRT.

The respective stages STG1 to STGi receive a set control signal through the respective set control terminals ST. Herein, the set control signal applied to a predetermined one of the stages may be a carry signal or a gate signal output from at least one of stages that are operated prior to the predetermined one of the stages (i.e., previous stages).

In an exemplary embodiment, as illustrated in FIG. 2, the n-th stage STGn receives an (n−1)-th carry signal CRn−1 output from the (n−1)-th stage STGn−1, for example. As another example, the set control signal may be a carry signal or a gate signal output from one of stages that are positioned further ahead of the previous stage, for example, an (n−y)-th stage (y is a natural number larger than 2 and less than "n").

The set control signal input to the first stage STG1 that is operated firstly in a single frame period FR may be a start vertical signal STV that notices the start of said one frame. The start vertical signal STV may be provided from the timing controller 800 (refer to FIG. 1).

The respective stages STG1 to STGi receive a reset control signal through the respective reset control terminals RT. Herein, the reset control signal applied to a predetermined one of the stages may be a carry signal or a gate signal output from at least one of stages that are operated subsequently to the predetermined one of the stages (i.e., subsequent stages).

In an exemplary embodiment, as illustrated in FIG. 2, the n-th stage STGn receives an (n+1)-th carry signal CRn+1 output from the (n+1)-th stage STGn+1, for example. As another example, the reset control signal may be a carry signal or a gate signal output from one of stages that are positioned further subsequent with respect to the subsequent stage, for example, an (n+z)-th stage (z is a natural number larger than 2).

The reset control signal that is applied to the i-th stage STGi, which is operated lastly in the single frame period FR among the stages for driving the gate line, is a dummy carry signal CRi+1. The dummy carry signal CRi+1 is output from the dummy stage STGi+1. In an alternative example, the start vertical signal STV may be used as the reset control signal of the last stage STGi.

The reset control signal applied to the dummy stage STGi+1 that is operated lastly in the single frame period FR may be the aforementioned start vertical signal STV. The dummy stage STGi+1 is not connected to the gate line.

Herein, one frame period FR, as illustrated in FIG. 3, may be divided into an active period A and a blank period B. The active period A is a period in which the start vertical signal STV, the first clock signal CLK1 and the second clock signal CLK2 are normally output, and the blank period B is a period in which various signals desired for a succeeding frame period are set. However, an image data signal desired for displaying an image is not included in the aforementioned various signals. That is, the image data signal is not generated in the blank period B.

The respective stages STG1 to STGi+1 receive a common reset control signal CRS through respective common reset control terminals CRT. The common reset control signal CRS may be applied to each stage STG1 to STGi+1 in the blank period B of one frame period FR.

Respective stage STG1 to STGi output the gate signal through the respective gate output terminals GOT. The gate signals GT1 to GTi from the stages STG1 to STGi may be applied to the gate lines GL1 to GLi, respectively.

As an example, the n-th gate signal GTn output from the n-th stage STGn may be applied to the n-th gate line GLn. As another example, the n-th gate signal GTn output from the n-th stage STGn may be applied to the n-th gate line GLn and the (n−1)-th stage STGn−1. As another example, the n-th gate signal GTn may be applied to the n-th gate line GLn and the (n−y)-th stage. As another example, the n-th gate signal GTn may be applied to the n-th gate line GLn, the (n−1)-th stage STGn−1 and the (n+1)-th stage STGn+1. As another example, the n-th gate signal GTn may be applied to the n-th gate line GLn, the (n−y)-th stage, and the (n+z)-th stage.

The respective stages STG1 to STGi output the carry signal through the respective carry output terminals COT.

As an example, the n-th stage STGn may output an n-th carry signal CRn through the respective carry output terminals COT. The n-th carry signal CRn may be applied to the (n−1)-th stage STGn−1. As another example, the n-th carry signal CRn may be applied to the (n−1)-th stage STGn−1 and the (n+1)-th stage STGn+1. As another example, the n-th carry signal CRn may be applied to the (n−y)-th stage and the (n+z)-th stage.

The respective stages STG1 to STGi receive the clock signal through the respective clock input terminals CLT.

In an exemplary embodiment, odd-numbered stages STG1, STGn, . . . , and STGi+1 may receive a first clock signal CLK1, and even-numbered stages . . . , STGn−1, STGn+1, STGi may receive a second clock signal CLK2, for example. As another example, the odd-numbered stages STG1, STGn, . . . , and STGi+1 may receive the second clock signal CLK2, and the even-numbered stages . . . , STGn−1, STGn+1, STGi may receive the first clock signal CLK1. The second clock signal CLK2 has a phase shifted (inverted) by 180 degrees with respect to a phase of the first clock signal CLK1.

The first clock signal CLK1 and the second clock signal CLK2 are signals used to generate the gate signals and the carry signals of each of the respective stages STG1 to STGi, and each of the stages STG1 to STGi receives one of the first clock signal CLK1 and the second clock signal CLK2 to output the gate signal and the carry signal.

In an exemplary embodiment, the odd-numbered stages STG1, STGn, . . . , and STGi+1 receive the first clock signal CLK1 to output the gate signal and the carry signal, and the even-numbered stages . . . , STGn−1, STGn+1, STGi receive the second clock signal CLK2 to output the gate signal and the carry signal, for example.

The first clock signal CLK1 is a pulse signal periodically alternating between a high voltage and a low voltage, and the high voltage of the first clock signal CLK1 has a level that may turn on the aforementioned pixel transistor and a switching element in the stage to be further described below. Similarly, the second clock signal CLK2 is a pulse signal periodically alternating between a high voltage and a low voltage, and the high voltage of the second clock signal CLK2 has a level that may turn on the aforementioned pixel transistor and the switching element in the stage to be further described below.

The low voltage of the first clock signal CLK1 may have a level that may turn off the aforementioned pixel transistor and the switching element in the stage to be further described below. Similarly, the low voltage of the second clock signal CLK2 has a level that may turn off the aforementioned pixel transistor and the switching element in the stage to be further described below.

The start vertical signal STV is applied to the first stage STG1 that is operated firstly in time in the single frame period FR. The start vertical signal STV may serve to set the first stage STG1.

The start vertical signal STV is output prior to the first and second clock signals CLK1 and CLK2 output in the single frame period FR. Each of the first and second clock signals CLK1 and CLK2 has the high voltage a plurality of times in the single frame period FR, while the start vertical signal STV has the high voltage a single time in the single frame period FR. That is, the start vertical signal STV has a frequency lower than that of the first and second clock signals CLK1 and CLK2.

Two types of clock signals having a phase difference, that is, the clock signals having two phases, are illustrated in FIG. 3. However, three or more types of clock signals having a phase difference may be used.

Although not illustrated, the first and second clock signals CLK1 and CLK2 may be output to overlap each other. In an exemplary embodiment, in a case where a high period of the first clock signal CLK1 is divided into a first half period and a second half period and a high period of the second clock signal CLK2 is divided into a first half period and a second half period, the second half period of the first clock signal CLK1 and the first half period of the second clock signal CLK2 may overlap each other in time, for example.

In addition, the start vertical signal STV may overlap one of the first clock signal CLK1 and the second clock signal CLK2. In the exemplary embodiment, the start vertical signal STV may overlap the clock signal completely or may overlap a part of the one of the first clock signal CLK1 and the second clock signal CLK2.

The first clock signal CLK1 and the second clock signal CLK2 are applied from the timing controller 800. The first clock signal CLK1 output from the timing controller 800 may be applied to the odd-numbered stages STG1, STGn, . . . , and STGi+1 through the first clock line CL1. The second clock signal CLK2 output from the timing controller 800 may be applied to the even-numbered stages . . . , STGn−1, STGn+1, STGi through the second clock line CL2.

The respective stages STG1 to STGi receive a first off voltage VSS1 through the respective first off-voltage input terminals OVT1. The first off voltage VS S1 is a direct current ("DC") voltage.

The respective stages STG1 to STGi receive a second off voltage VSS2 through the respective second off-voltage input terminals OVT2. The second off voltage VSS2 is a DC voltage, and may have a level that is less than that of the first off voltage VSS1. In an exemplary embodiment, in a case where the first off voltage VSS1 is −12 volts (V), the second off voltage VSS2 may be −14 V, for example.

The low voltage of the above-described first clock signal CLK1 may have a substantially equal level as a level of the second off voltage VSS2. Similarly, the low voltage of the above-described second clock signal CLK2 have a substantially equal level as a level of the second off voltage VSS2.

The first off voltage VSS1 and the second off voltage VSS2 may be applied from the power apply 605. The first off voltage VSS1 output from the power apply 605 may be applied to the entirety of the stages STG1 to STGi+1 as a common voltage through the first off line VSL1. The second off voltage VSS2 output from the power apply 605 may be applied to the entirety of the stages STG1 to STGi+1 as a common voltage through the second offline VSL2.

The dummy stage STGi+1 has a substantially same configuration as the configuration of one of the aforementioned stages. However, the dummy stage STGi+1, as illustrated in FIG. 2, may not include the gate output terminal GOT.

The stages STG1 to STGi and the dummy stage STGi+1 having the aforementioned configuration sequentially output the gate signals GT1 to GTi and the carry signals CR1 to CRi from the first stage STG1 to the i-th stage STGi during one frame period FR. Subsequent to a last gate signal GTi and a last carry signal CRi are generated from the i-th stage STGi, the dummy stage STGi+1 outputs the dummy carry signal CRi+1. The dummy carry signal CRi+1 is only applied to the i-th stage STGi.

In FIGS. 3A and 3B, the first to (n+2)-th gate signals GT1 to GTn+2 are represented by solid lines, and the first to (n+2)-th carry signals CR1 to CRn+2 are represented by dashed lines.

Figure 4:
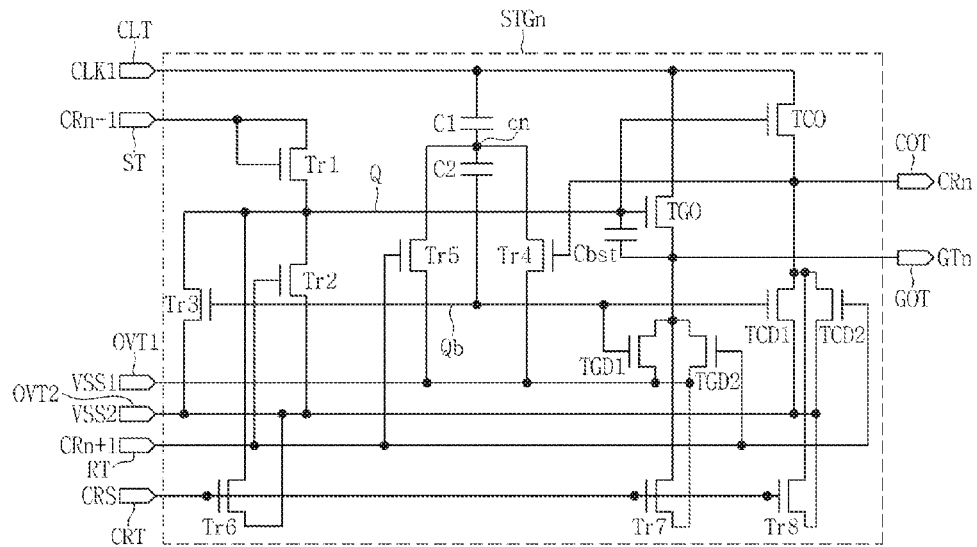
FIG. 4 is a diagram illustrating an exemplary embodiment of an n-th stage of FIG. 2.

FIG. 4 is a diagram illustrating an n-th stage STGn of FIG. 2.

As illustrated in FIG. 4, the n-th stage STGn may include a first switching element Tr1, a second switching element Tr2, a third switching element Tr3, a fourth switching element Tr4, a fifth switching element Tr5, a sixth switching element Tr6, a seventh switching element Tr7, an eighth switching element Tr8, a gate output switching element TGO, a carry output switching element TCO, a first gate discharge switching element TGD1, a second gate discharge switching element TGD2, a first carry discharge switching element TCD1, a second carry discharge switching element TCD2, a bootstrapping capacitor Cbst, a first capacitor C1 and a second capacitor C2.

The first switching element Tr1 of the n-th stage STGn charges a set node Q of the n-th stage STGn based on a set control signal. The set control signal may be an (n−1)-th gate signal GTn−1 applied from the (n−1)-th stage STGn−1. The first switching element Tr1 of the n-th stage STGn is turned on or turned off by the (n−1)-th carry signal CRn−1, and when turned on, the first switching element Tr1 electrically connects the set control terminal ST of the n-th stage STGn and the set node Q of the n-th stage STGn. To this end, the first switching element Tr1 includes a gate electrode connected to the set control terminal ST, and is connected between the set control terminal ST and the set node Q.

Figure 15:
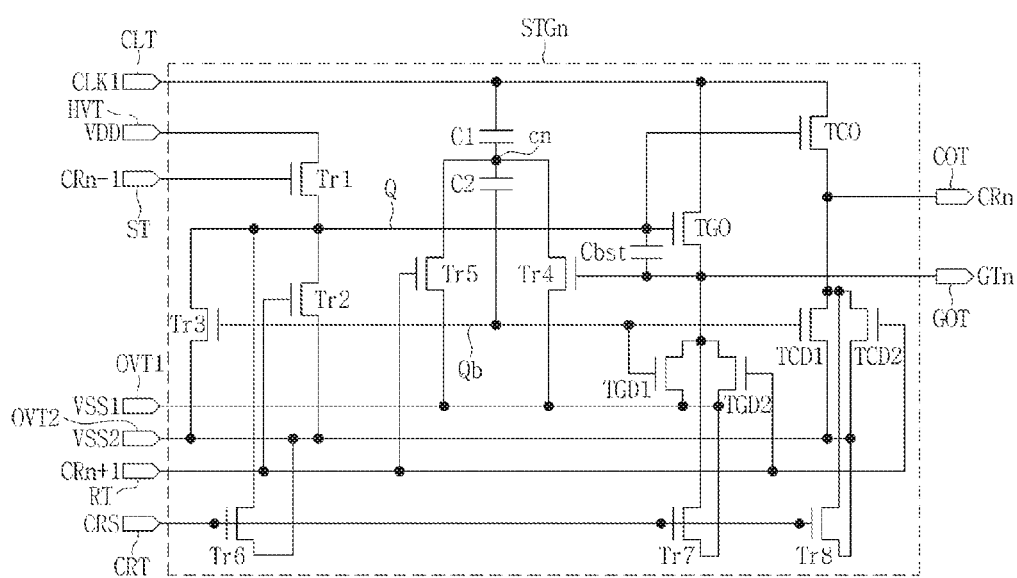
FIG. 15 is a diagram illustrating another exemplary embodiment of an n-th stage of FIG. 2.

In an exemplary embodiment of FIG. 15, the n-th stage STGn may further include a high voltage input terminal HVT. In the exemplary embodiment, a drain electrode (or a source electrode) of the first switching element Tr1 of the n-th stage STGn may be connected to the high voltage input terminal HVT instead of the set control terminal ST. This high voltage input terminal may transmit a DC high voltage VDD, and the DC high voltage VDD may have a substantially equal level as that of an ON voltage Von.

In an exemplary embodiment, the first switching element Tr1 of the first stage STG1 may receive the vertical start signal STV as the set control signal.

The second switching element Tr2 of the n-th stage STGn discharges the set node Q of the n-th stage STGn based on a reset control signal. The reset control signal may be an (n+1)-th carry signal CRn+1 applied from the (n+1)-th stage STGn+1. The second switching element Tr2 of the n-th stage STGn is turned on or turned off by the (n+1)-th carry signal CRn+1, and when turned on, the second switching element Tr2 electrically connects the set node Q of the n-th stage STGn and the second off voltage terminal OVT2. To this end, the second switching element Tr2 includes a gate electrode connected to the reset control terminal RT, and is connected between the set node Q and the second off voltage input terminal OVT2.

In an exemplary embodiment, the second switching element Tr2 of the dummy stage STGi+1 may receive the vertical start signal STV as the reset control signal.

The third switching element Tr3 of the n-th stage STGn discharges the set node Q of the n-th stage STGn based on a signal applied to the reset node Qb of the n-th stage STGn. The third switching element Tr3 of the n-th stage STGn is turned on or turned off by the signal applied to the reset node Qb, and when turned on, the third switching element Tr3 electrically connects the set node Q of the n-th stage STGn and the second off voltage terminal OVT2. To this end, the third switching element Tr3 includes a gate electrode connected to the reset control node Qb, and is connected between the set node Q and the second off voltage input terminal OVT2.

The bootstrapping capacitor Cbst of the n-th stage STGn is connected between the set node Q of the n-th stage STGn and the gate output terminal GOT of the n-th stage STGn. The bootstrapping capacitor Cbst may be a parasitic capacitor provided between a gate electrode and a source electrode (or a drain electrode) of the gate output switching element TGO.

The first capacitor C1 and the second capacitor C2 of the n-th stage STGn are connected between the clock input terminal CLT of the n-th stage STGn and the reset node Qb of the n-th stage STGn. In an exemplary embodiment, the first capacitor C1 is connected between the clock input terminal CLT and the capacitor node cn, and the second capacitor C2 is connected between the capacitor node cn and the reset node Qb, for example. When the fourth and fifth switching elements Tr4 and Tr5 are turned off, the first capacitor C1 and the second capacitor C2 are connected in series between the clock input terminal CLT and the reset node Qb.

The fourth switching element Tr4 of the n-th stage STGn applies a DC voltage to the capacitor node cn of the n-th stage STGn based on a signal applied to the carry output terminal COT of the n-th stage STGn. The DC voltage may be, for example, the first off voltage VSS1. The fourth switching element Tr4 of the n-th stage STGn is turned on or off by the n-th carry signal CRn applied to the carry output terminal COT, and when turned on, the fourth switching element Tr4 electrically connects the capacitor node cn and the first off-voltage input terminal OVT1 of the n-th stage STGn. To this end, the fourth switching element Tr4 includes a gate electrode connected to the carry output terminal COT, and is connected between the capacitor node cn and the first off voltage input terminal OVT1.

In an exemplary embodiment, as shown in FIG. 15, the fourth switching element Tr4 of the n-th stage STGn may be connected to the gate output terminal GOT of the n-th stage STGn instead of the carry output terminal COT of the n-th stage STGn.

The fifth switching element Tr5 of the n-th stage STGn applies a DC voltage to the capacitor node cn of the n-th stage STGn based on a signal applied to the reset control terminal RT of the n-th stage STGn. The DC voltage may be, for example, the first off voltage VSS1. In addition, the reset control signal may be the (n+1)-th carry signal CRn+1 from the (n+1)-th stage STGn+1. The fifth switching element Tr5 of the n-th stage STGn is turned on or off by the (n+1)-th carry signal CRn+1 applied to the reset control terminal RT, and when turned on, the fifth switching element Tr5 electrically connects the capacitor node cn and the first off-voltage input terminal OVT1 of the n-th stage STGn. To this end, the fifth switching element Tr5 includes a gate electrode connected to the reset control terminal RT, and is connected between the capacitor node cn and the first off voltage input terminal OVT1.

In an exemplary embodiment, the fifth switching element Tr5 of the dummy stage STGi+1 may receive the vertical start signal STV as the reset control signal.

In an exemplary embodiment, although not illustrated, the fifth switching element Tr5 of the n-th stage STGn may be connected to a gate output terminal of the (n+1)-th stage STGn+1 instead of the carry output terminal of the (n+1)-th stage STGn+1.

In another exemplary embodiment, the n-th stage STGn may not include the fifth switching element Tr5.

The sixth switching element Tr6 of the n-th stage STGn discharges the set node Q of the n-th stage STGn based on the common reset control signal CRS applied to the common reset control terminal CRT of the n-th stage STGn. The sixth switching element Tr6 of the n-th stage STGn is turned on or turned off by the common reset control signal CRS, and when turned on, the sixth switching element Tr6 electrically connects the set node Q of the n-th stage STGn and the second off voltage terminal OVT2. To this end, the sixth switching element Tr6 includes a gate electrode connected to the common reset control terminal CRT, and is connected between the set node Q and the second off voltage input terminal OVT2.

The seventh switching element Tr7 of the n-th stage STGn discharges the gate output terminal GOT of the n-th stage STGn based on the common reset control signal CRS applied to the common reset control terminal CRT of the n-th stage STGn. The seventh switching element Tr7 of the n-th stage STGn is turned on or turned off by the common reset control signal CRS, and when turned on, the seventh switching element Tr7 electrically connects the gate output terminal GOT of the n-th stage STGn and the first off voltage terminal OVT1. To this end, the seventh switching element Tr7 includes a gate electrode connected to the common reset control terminal CRT, and is connected between the gate output terminal GOT and the first off voltage input terminal OVT1.

The eighth switching element Tr8 of the n-th stage STGn discharges the carry output terminal COT of the n-th stage STGn based on the common reset control signal CRS applied to the common reset control terminal CRT of the n-th stage STGn. The eighth switching element Tr8 of the n-th stage STGn is turned on or turned off by the common reset control signal CRS, and when turned on, the eighth switching element Tr8 electrically connects the carry output terminal COT of the n-th stage STGn and the second off voltage terminal OVT2. To this end, the eighth switching element Tr8 includes a gate electrode connected to the common reset control terminal CRT, and is connected between the carry output terminal COT and the second off voltage input terminal OVT2.

The gate output switching element TGO of the n-th stage STGn outputs the n-th gate signal GTn based on a signal applied to the set node Q of the n-th stage STGn. The gate output switching element TGO of the n-th stage STGn is turned on or off by the signal of the set node Q, and when turned on, the gate output switching element TGO electrically connects the clock input terminal CLT and the gate output terminal GOT of the n-th stage STGn. To this end, the gate output switching element TGO includes a gate electrode connected to the set node Q, and is connected between the clock input terminal CLT and the gate output terminal GOT.

The carry output switching element TCO of the n-th stage STGn outputs the n-th carry signal CRn based on a signal applied to the set node Q of the n-th stage STGn. The carry output switching element TCO of the n-th stage STGn is turned on or turned off by the signal of the set node Q, and when turned on, the carry output switching element TCO electrically connects the clock input terminal CLT of the n-th stage STGn and the carry output terminal COT of the n-th stage STGn. To this end, the carry output switching element TCO includes a gate electrode connected to the set node Q, and is connected between the clock terminal CLT and the carry output terminal COT.

The first gate discharge switching element TGD1 of the n-th stage STGn discharges the gate output terminal GOT of the n-th stage STGn based on the signal applied to the reset node Qb of the n-th stage STGn. The first gate discharge switching element TGD1 of the n-th stage STGn is turned on or turned off by the signal applied to the reset node Qb, and when turned on, the first gate discharge switching element TGD1 electrically connects the gate output terminal GOT and the first off-voltage input terminal OVT1 of the n-th stage STGn. To this end, the first gate discharge switching element TGD1 includes a gate electrode connected to the reset node Qb and is connected between the gate output terminal GOT and the first off-voltage input terminal OVT1.

The second gate discharge switching element TGD2 of the n-th stage STGn discharges the gate output terminal GOT of the n-th stage STGn based on a reset control signal applied to the reset control terminal RT of the n-th stage STGn. The reset control signal may be the (n+1)-th carry signal CRn+1 applied from the (n+1)-th stage STGn+1. The second gate discharge switching element TGD2 of the n-th stage STGn is turned on or turned off by the (n+1)-th carry signal CRn+1, and when turned on, the second gate discharge switching element TGD2 electrically connects the gate output terminal GOT and the first off-voltage input terminal OVT1 of the n-th stage STGn. To this end, the second gate discharge switching element TGD2 includes a gate electrode connected to the reset control terminal RT of the n-th stage STGn, and is connected between the gate output terminal GOT and the first off-voltage input terminal OVT1.

In an exemplary embodiment, a gate electrode of the second gate discharge switching element TGD2 of the dummy stage STGi+1 may receive the vertical start signal STV as the reset control signal.

The first carry discharge switching element TCD1 of the n-th stage STGn discharges the carry output terminal COT of the n-th stage STGn based on a signal applied to the reset node Qb of the n-th stage STGn. The first carry discharge switching element TCD1 of the n-th stage STGn is turned on or turned off by the signal applied to the reset node Qb, and when turned on, the first carry discharge switching element TCD1 electrically connects the carry output terminal COT and the second off-voltage input terminal OVT2 of the n-th stage STGn. To this end, the first carry discharge switching element TCD1 includes a gate electrode connected to the reset node Qb, and is connected between the carry output terminal COT and the second off-voltage input terminal OVT2.

The second carry discharge switching element TCD2 of the n-th stage STGn discharges the carry output terminal COT of the n-th stage STGn based on a reset control signal applied to the reset control terminal RT of the n-th stage STGn. The reset control signal may be the (n+1)-th carry signal CRn+1 applied from the (n+1)-th stage STGn+1. The second carry discharge switching element TCD2 of the n-th stage STGn is turned on or turned off by the (n+1)-th carry signal CRn+1, and when turned on, the second carry discharge switching element TCD2 electrically connects the carry output terminal COT and the second off-voltage input terminal OVT2 of the n-th stage STGn. To this end, the second carry discharge switching element TCD2 includes a gate electrode connected to the reset control terminal RT, and is connected between the carry output terminal COT and the second off-voltage input terminal OVT2.

In an exemplary embodiment, a gate electrode of the second carry discharge switching element TCD2 of the dummy stage STGi+1 may receive the vertical start signal STV as the reset control signal.

The operation of the n-th stage STGn will be described in detail with reference to FIGS. 3, 5A, 5B, 5C and 5D.

FIGS. 5A, 5B, 5C and 5D are diagrams illustrating the operation of the n-th stage STGn for each period. In FIGS. 5A, 5B, 5C and 5D, a switching element surrounded by a circular dashed line is a switching element in a turned-on state, and the other switching elements are switching elements in a turn-off state. In addition, in FIGS. 5A, 5B, 5C and 5D, the reference numeral surrounded by a dashed line means that a signal it represents has a level of on-voltage, for example, a high voltage level.

1) Set period (Ts)

Figure 5A:
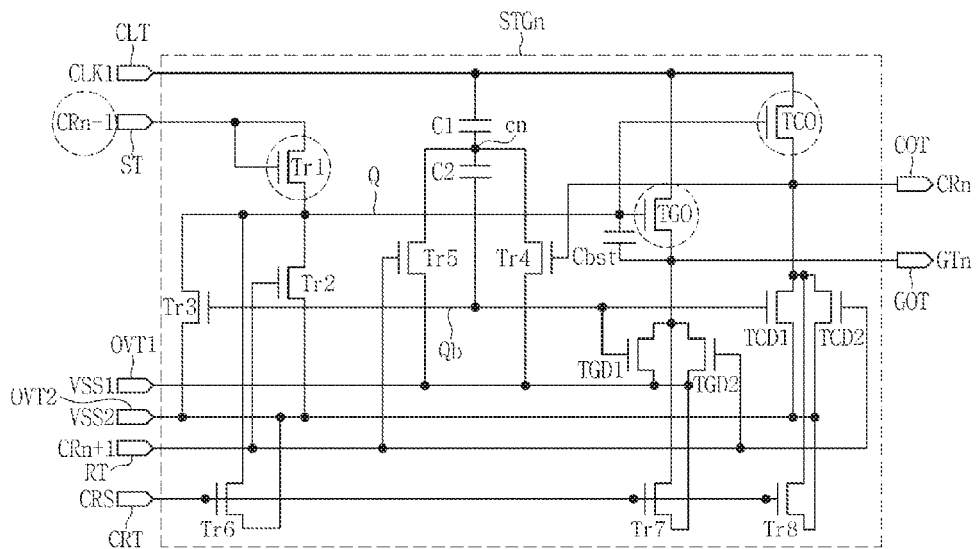
FIGS. 5A, 5B, 5C and 5D are diagrams illustrating the operation of the n-th stage for each period.

The operation of the n-th stage STGn in a set period Ts of the n-th stage STGn is to be described hereinbelow with reference to FIGS. 3A, 3B and 5A.

In the set period Ts of the n-th stage STGn, as illustrated in FIGS. 3A and 3B, the first clock signal CLK1 maintains a low voltage level corresponding to the second off voltage VSS2, the second clock signal CLK2 maintains a high voltage level corresponding to the on voltage Von, and each of the (n−1)-th gate signal GTn−1 and the (n−1)-th carry signal CRn−1 from the (n−1)-th stage STGn−1 maintains a high voltage level corresponding to the on voltage Von. Although not illustrated, in the set period Ts of the n-th stage STGn, the common reset control signal CRS may maintain a low voltage level corresponding to the first off voltage VSS1 or the second off voltage VSS2.

The (n−1)-th carry signal CRn−1, having a high voltage level, output from the (n−1)-th stage STGn−1 is applied to the gate electrode of the first switching element Tr1 provided in the n-th stage STGn. Then, the first switching element Tr1 of the n-th stage STGn is turned on, and the (n−1)-th carry signal CRn−1, having a high voltage level, is applied to the set node Q of the n-th stage STGn through the turned-on first switching element Tr1. Accordingly, the set node Q is charged, and the gate output switching element TGO and the carry output switching element TCO, connected to the charged set node Q through the gate electrode, are turned on.

The first clock signal CLK1, having a low voltage level, is applied to the gate output terminal GOT of the n-th stage STGn through the turned-on gate output switching element TGO. Accordingly, the gate output terminal GOT of the n-th stage STGn is discharged. In an exemplary embodiment, the n-th gate signal GTn and the n-th carry signal CRn are separately illustrated in the enlarged view of FIG. 3 (the portion surrounded by the dashed line), for example. As illustrated in the enlarged view of FIG. 3, the voltage of the gate output terminal GOT of the n-th stage STGn may have a level substantially equal to the second off-voltage VSS2 during the set period Ts.

The first clock signal CLK1, having a low voltage level, is applied to the carry output terminal COT of the n-th stage STGn through the turned-on carry output switching element TCO. Accordingly, the carry output terminal COT of the n-th stage STGn is discharged. In an exemplary embodiment, as illustrated in the enlarged view of FIG. 3, in the set period Ts, the voltage of the carry output terminal COT of the n-th stage STGn may have a substantially equal level to a level of the second off-voltage VSS2, for example.

The fourth switching element Tr4 connected to the discharged carry output terminal COT through the gate electrode is turned off As illustrated in FIG. 3, since the (n+1)-th carry signal CRn+1 is held at the low voltage level in the set period Ts, each of the second switching element Tr2, the fifth switching element Tr5, the second gate discharge switching element TGD2 and the second carry discharge switching element TCD2 of the n-th stage STGn which receive the (n+1)-th carry signal CRn+1 through the respective gate electrodes is turned off.

In addition, since the common reset control signal CRS maintains the low voltage level in this set period Ts, each of the sixth switching element Tr6, the seventh switching element Tr7 and the eighth switching element Tr8 of the n-th stage STGn which receive the common reset control signal CRS, having a low voltage level, through the respective gate electrodes is turned off.

As the above-described fourth switching element Tr4 and fifth switching element Tr5 are turned off, the capacitor node cn of the n-th stage STGn is substantially in a floating state in this set period Ts. Accordingly, the first clock signal CLK1, having a low voltage level, from the clock input terminal CLT is applied to the capacitor node cn by the coupling effect of the first capacitor C1 and the first clock signal CLK1, having a low voltage level, is applied to the reset node Qb by the coupling effect of the second capacitor C2. Then, the reset node Qb of the n-th stage STGn is discharged, and the third switching element Tr3, the first gate discharge switching element TGD1 and the first carry discharge switching element TCD1 of the n-th stage STGn which are connected to the discharged reset node Qb through the respective gate electrodes are turned off.

As such, while the set node Q of the n-th stage STGn is charged with a high voltage in the set period Ts of the n-th stage STGn, the reset node Qb of the n-th stage STGn is discharged to a low voltage. That is, the n-th stage STGn is set in the set period Ts of the n-th stage STGn.

2) Output Period (To)

Figure 5B:
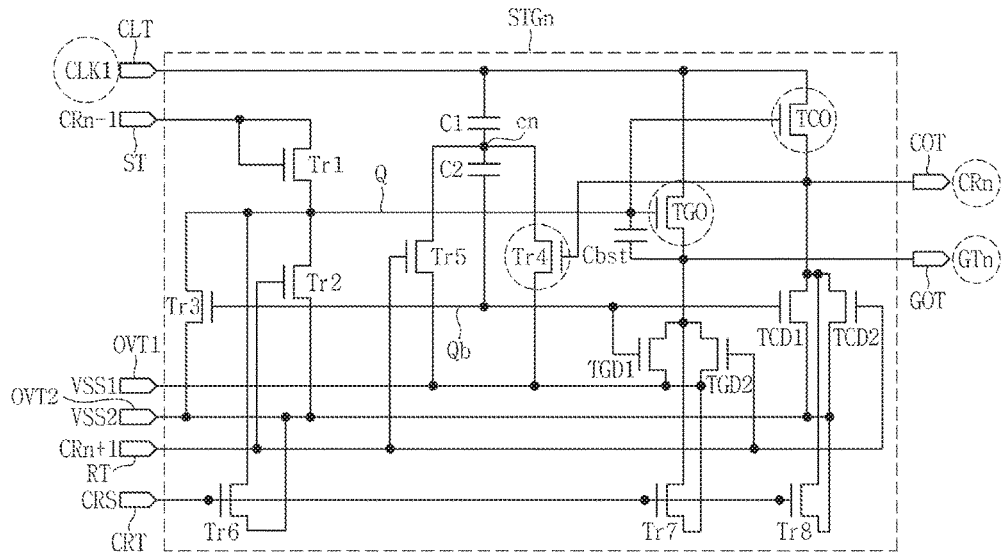

Subsequently, the operation of the n-th stage STGn in an output period To of the n-th stage STGn will be described with reference to FIGS. 3A, 3B and 5B.

In the output period To of the n-th stage STGn, as illustrated in FIGS. 3A and 3B, the first clock signal CLK1 maintains a high voltage level corresponding to the on voltage Von, the second clock signal CLK2 maintains a low voltage level corresponding to the second off voltage VSS2, the (n−1)-th gate signal GTn−1 from the (n−1)-th stage STGn−1 maintains a low voltage level corresponding to the first off voltage VSS1, and the (n−1)-th carry signal CRn−1 from the (n−1)-th stage STGn−1 maintains a low voltage level corresponding to the second off voltage VSS2. Although not illustrated, the common reset control signal CRS has a low voltage level corresponding to the first off-voltage VSS1 or the second off-voltage VSS2 in the output period To of the n-th stage STGn.

The (n−1)-th carry signal CRn−1, having a low voltage level, output from the (n−1)-th stage STGn−1 is applied to the gate electrode of the first switching element Tr1 provided in the n-th stage STGn. Accordingly, the first switching element Tr1 is turned off.

As the first switching element Tr1 is turned off, the set node Q of the n-th stage STGn is floated in the output period To. The set node Q in a floating state maintains a charged state by the (n−1)-th carry signal CRn−1, having a high voltage level, which is applied thereto in the aforementioned set period Ts. Accordingly, the gate output switching element TGO and the carry output switching element TCO of the nth stage STGn connected to the charged set node Q through the respective gate electrodes maintain the turned-on state.

In an exemplary embodiment, in the output period To, the first clock signal CLK1 having a high voltage level is applied to the gate output switching element TGO and the carry output switching element TCO which are turned on. In the exemplary embodiment, due to a coupling phenomenon arising from respective parasitic capacitors of the gate output switching element TGO and the carry output switching element TCO, the signal of the set node Q is bootstrapped when the first clock signal CLK1 is applied to the gate output switching element TGO and the carry output switching element TCO.

In addition, when the set node Q is bootstrapped, the signal of the gate output terminal GOT is also bootstrapped based on the coupling phenomenon of the bootstrapping capacitor Cbst. Accordingly, the gate output switching element TGO and the carry output switching element TCO which are turned on may output the first clock signal CLK1 of a high voltage level with substantially no loss.

The turned-on gate output switching element TGO outputs, through the gate output terminal GOT, the first clock signal CLK1 having a high voltage level as the n-th gate signal GTn. In an exemplary embodiment, as illustrated in the enlarged view of FIG. 3, the voltage of the gate output terminal GOT of the n-th stage STGn in the output period To may have a substantially equal level to a level of the on-voltage Von, for example.

The n-th gate signal GTn output through the gate output terminal GOT of the n-th stage STGn is applied to the n-th gate line GLn.

The turned-on carry output switching element TCO outputs the first clock signal CLK1, having a high voltage level, through the carry output terminal COT as the n-th carry signal CRn. In an exemplary embodiment, as illustrated in the enlarged view of FIG. 3, in the output period To, the voltage of the carry output terminal COT of the n-th stage STGn has a substantially equal level to a level of the on-voltage Von, for example.

The n-th carry signal CRn, having a high voltage level, output through the carry output terminal COT of the n-th stage STGn is applied to the gate electrode of the fourth switching element Tr4 provided in the n-th stage STGn. Accordingly, the fourth switching element Tr4 is turned on, and the first off voltage VSS1, which is a DC voltage, is applied to the capacitor node cn through the fourth switching element Tr4 which is turned on.

As described above, the coupling effect of the first and second capacitors C1 and C2 disappears as DC voltage is applied to the capacitor node cn during the output period To of the n-th stage STGn. Accordingly, the first clock signal CLK1, having a high voltage level, applied to the clock input terminal CLT during this output period To is not applied to the reset node Qb of the n-th stage STGn.

Accordingly, the voltage of the reset node Qb remains unchanged during the output period To. In other words, the reset node Qb is kept discharged by the first clock signal CLK1, having a low voltage level, having applied in the set period Ts described above.

Accordingly, during the output period To, the third switching element Tr3, the first gate discharge switching element TGD1 and the first carry discharge switching element TCD1 of the n-th stage STGn connected to the discharged reset node Qb through the respective gate electrodes thereof maintain the turned-off state.

As such, since the first and second capacitors C1 and C2 do not perform the coupling function during the output period To of the n-th stage STGn, the n-th gate signal GTn and the n-th carry signal CRn may be normally output during the output period To.

In addition, the n-th carry signal CRn output through the carry output terminal COT of the n-th stage STGn is applied to the set control terminal ST of the (n+1)-th stage STGn+1 and the reset control terminal RT of the (n−1)-th stage STGn−1. In other words, the n-th carry signal CRn is applied to the gate electrode and the drain electrode of the first switching element provided in the (n+1)-th stage STGn+1. The n-th carry signal CRn is also applied to respective gate electrodes of the second switching element, the fifth switching element, and the second gate discharge switching element provided in the (n−1)-th stage STGn−1. Accordingly, the (n+1)-th stage STGn+1 is set, and the (n−1)-th stage STGn−1 is reset.

In addition, since the common reset control signal CRS maintains the low voltage level in this set period Ts, each of the sixth switching element Tr6, the seventh switching element Tr7, and the eighth switching element Tr8 of the n-th stage STGn which receive the common reset control signal CRS, having a low voltage level, through the respective gate electrodes thereof is turned off.

As such, the n-th gate signal GTn and the n-th carry signal CRn are output from the n-th stage STGn in the output period To of the n-th stage STGn. Then, the (n+1)-th stage STGn+1 is set while the (n−1)-th stage STGn−1 is reset by the n-th carry signal CRn.

3) Reset Period (Trs)

Figure 5C:
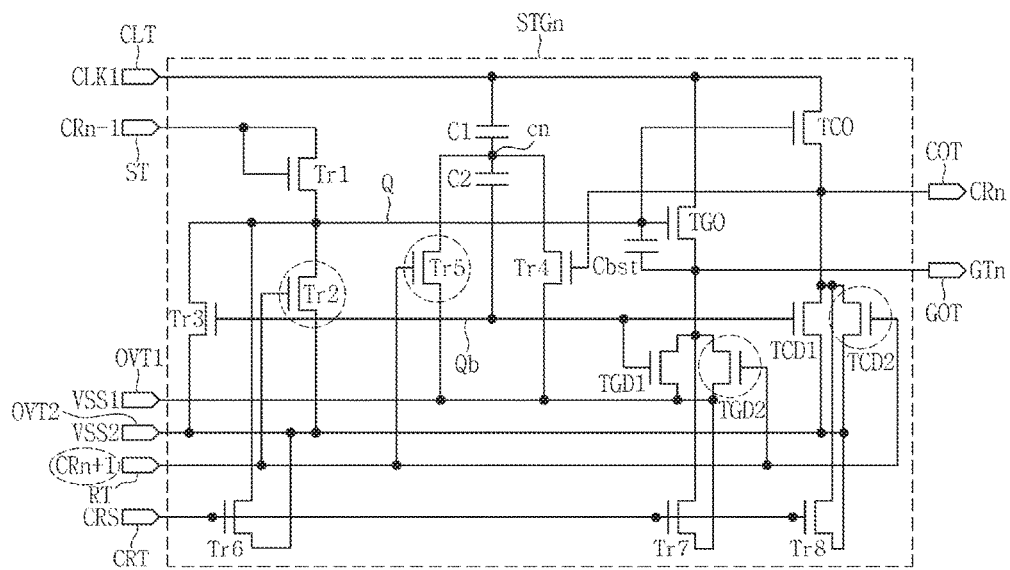

Subsequently, the operation of the n-th stage STGn in the reset period Trs of the n-th stage STGn will be described with reference to FIGS. 3A, 3B and 5C.

In the reset period Trs of the n-th stage STGn, as illustrated in FIGS. 3A and 3B, the first clock signal CLK1 maintains a low voltage level corresponding to the second off voltage VSS2, the second clock signal CLK2 maintains a high voltage level corresponding to the on voltage Von, and each of the (n+1)-th gate signal GTn+1 and the (n+1)-th carry signal CRn+1 from the (n+1)-th stage STGn+1 maintain a high voltage level corresponding to the on voltage Von. Although not illustrated, in the reset period Trs of the n-th stage STGn, the common reset control signal CRS may maintain a low voltage level corresponding to the first off-voltage VSS1 or the second off-voltage VSS2.

The (n+1)-th carry signal CRn+1, having a high voltage level, is applied to the respective gate electrodes of the second switching element Tr2, the fifth switching element Tr5, the second gate discharge switching element TGD2 and the second carry discharge switching element TCD2 provided in the n-th stage STGn. Then, the second switching element Tr2, the fifth switching element Tr5, the second gate discharge switching element TGD2 and the second carry discharge switching element TCD2 are turned on.

The second off voltage VSS2 is applied to the set node Q of the n-th stage STGn through the turned-on second switching element Tr2. Then, the set node Q is discharged, and the gate output switching element TGO and the carry output switching element TCO connected to the discharged set node Q through the respective gate electrodes are turned off.

The first off voltage VSS1, which is a DC voltage, is applied to the capacitor node cn through the turned-on fifth switching element Tr5. Accordingly, the coupling effect of the first capacitor C1 and the second capacitor C2 disappears, as described above.

Accordingly, the reset node Qb is kept discharged by the first clock signal CLK1, having a low voltage level, having applied in the set period Ts described above.

Accordingly, during the reset period Trs, the third switching element Tr3, the first gate discharge switching element TGD1 and the first carry discharge switching element TCD1 of the n-th stage STGn connected to the discharged reset node Qb through the respective gate electrodes thereof maintain a turned-off state.

The first off voltage VSS1 is applied to the gate output terminal GOT of the n-th stage STGn through the turned-on second gate discharge switching element TGD2. In an exemplary embodiment, as illustrated in the enlarged view of FIG. 3, in the reset period Trs, the voltage of the gate output terminal GOT of the n-th stage STGn may have a substantially equal level to a level of the first off-voltage VSS1, for example. Accordingly, the gate output terminal GOT and the n-th gate line GLn connected thereto are discharged.

The second off voltage VSS2 is applied to the carry output terminal COT of the n-th stage STGn through the turned-on second carry discharge switching element TCD2. In an exemplary embodiment, as illustrated in the enlarged view of FIG. 3, in the reset period Trs, the voltage of the carry output terminal COT of the n-th stage STGn may have a substantially equal level to a level of the second off-voltage VSS2, for example. Accordingly, the carry output terminal COT is discharged.

In the exemplary embodiment, the set control terminal ST of the (n+1)-th stage STGn+1 and the reset control terminal RT of the (n−1)-th stage STGn−1 connected to the discharged carry output terminal COT is discharged. Then, the first switching element provided in the (n+1)-th stage STGn+1 is turned off. Further, the second switching element, the fifth switching element, the second gate discharge switching element and the second carry discharge switching element provided in the (n−1)-th stage STGn−1 are turned off.

In addition, since the common reset control signal CRS maintains the low voltage level in this set period Ts, each of the sixth switching element Tr6, the seventh switching element Tr7 and the eighth switching element Tr8 of the n-th stage STGn which receive the common reset control signal CRS, having a low voltage level, through the respective gate electrodes thereof is turned off.

As such, the n-th stage STGn is reset as the set node Q is discharged to the low voltage in the reset period Trs of the n-th stage STGn.

4) Holding Period (Th)

Figure 5D:
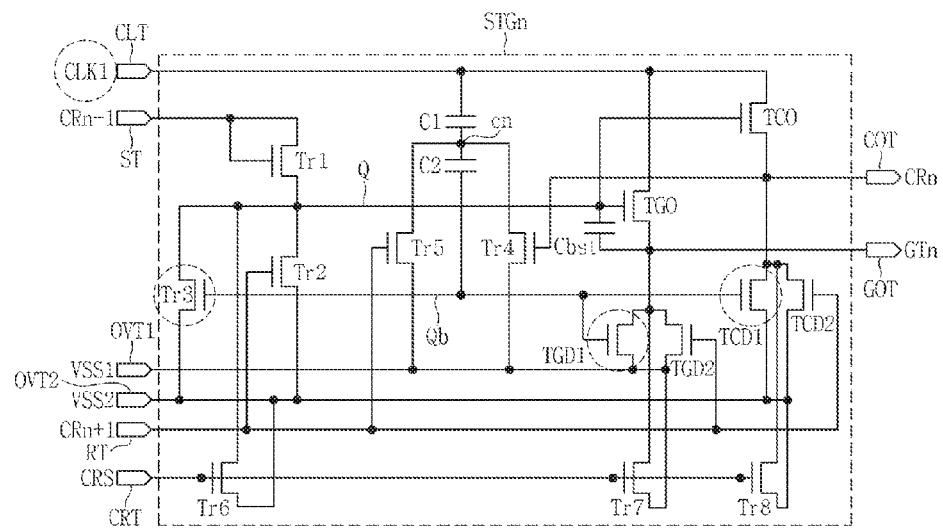

Next, the operation of the n-th stage STGn in the holding period Th of the n-th stage STGn will be described with reference to FIGS. 3A, 3B and 5D.

During the holding period Th of the n-th stage STGn, as illustrated in FIGS. 3A and 3B, the first clock signal CLK1 maintains a high voltage level corresponding to the on voltage Von, the second clock signal CLK2 maintains a low voltage level corresponding to the second off-voltage VSS2, the (n−1)-th gate signal GTn−1 from the (n−1)-th stage STGn−1 maintains a low voltage level corresponding to the first off-voltage VSS1, the (n−1)-th carry signal CRn−1 from the (n−1)-th stage STGn−1 maintains a low voltage level corresponding to the second off voltage VSS2, the n-the gate signal GTn from the n stage STGn maintains a low voltage level corresponding to the first off voltage VSS1, the n-th carry signal CRn from the n-th stage STGn maintains a low voltage level corresponding to the second off voltage VSS2, the (n+1)-th gate signal GTn+1 from the (n+1)-th stage STGn+1 maintains a low voltage level corresponding to the first off voltage VSS1, and the (n+1)-th carry signal CRn+1 from the (n+1)-th stage STGn+1 maintains a low voltage level corresponding to the second off-voltage VSS2. In addition, although not illustrated, in the holding period Th of the n-th stage STGn, the common reset control signal CRS may maintain a low voltage level corresponding to the first off voltage VSS1 or the second off voltage VSS2.

The first switching element Tr1 receiving the (n−1)-th carry signal CRn−1, having a low voltage level, through the gate electrode is turned off.

The fourth switching element Tr1 receiving the n-th carry signal CRn, having a low voltage level, through the gate electrode is turned off.

The second switching element Tr2, the fifth switching element Tr5, the second gate discharge switching element TGD2 and the second carry discharge switching element TCD2, which receive the (n+1)-th carry signal CRn+1, having a low voltage level, through the respective gate electrodes are turned off.

As the fourth switching element Tr4 and the fifth switching element Tr5 are all turned off in the holding period Th, the state of the capacitor node cn of the n-th stage STGn is changed to a floating state in the holding period Th. Accordingly, the first capacitor C1 and the second capacitor C2 may perform a coupling function. That is, the first clock signal CLK1, having a high voltage level, is applied from the clock input terminal CLT to the capacitor node cn by the coupling effect of the first capacitor C1, and the first clock signal CLK1, having a high voltage level, is applied from the capacitor node cn to the reset node Qb by the coupling effect of the second capacitor C2. Then, the reset node Qb of the n-th stage STGn is charged, and the third switching element Tr3, the first gate discharge switching element TGD1 and the first carry discharge switching element TCD1 of the n-th stage STGn which are connected to the charged reset node Qb through the respective gate electrodes are turned on.

The second off voltage VSS2 is applied to the set node Q of the n-th stage STGn through the turned-on third switching element Tr3. Thereby, the set node Q is discharged, and the gate output switching element TGO and the carry output switching element TCO connected to the discharged set node Q through the respective gate electrodes are turned off.

The first off voltage VSS1 is applied to the gate output terminal GOT of the n-th stage STGn through the turned-on first gate discharge switching element TGD1. Accordingly, the gate output terminal GOT and the n-th gate line GLn connected thereto are discharged.

The second off voltage VSS2 is applied to the carry output terminal COT of the n-th stage STGn through the turned-on first carry discharge switching element TCD1. Accordingly, the carry output terminal COT of the n-th stage STGn, the set control terminal ST of the (n+1)-th stage STGn+1 and the reset control terminal RT of the (n−1)-th stage STGn−1 are discharged.

In an exemplary embodiment, the first clock signal CLK1 alternates periodically between a high voltage level and a low voltage level, and whenever the first clock signal CLK1 maintains the high voltage level, the reset node Qb of the n-th stage STGn is charged by the first clock signal CLK1 by the coupling effect of the first and second capacitors C1 and C2.

Each time the reset node Qb is charged, the third switching element Tr3, the first gate discharge switching element TGD1 and the first carry discharge switching element TCD1 are turned on such that the set nodes Q, The gate output terminal GOT and the carry output terminal COT are stabilized by the first off voltage VSS1 or the second off voltage VSS2. Accordingly, the reset node Qb, the gate output terminal GOT and the carry output terminal COT of the reset n-th stage STGn are discharged periodically based on the first clock signal CLK1 until the n-th stage STGn is set again.

In addition, since the common reset control signal CRS maintains the low voltage level in this set period Ts, each of the sixth switching element Tr6, the seventh switching element Tr7 and the eighth switching element Tr8 of the n-th stage STGn which receive the common reset control signal CRS, having a low voltage level, through the respective gate electrodes is turned off.

In an exemplary embodiment, although not illustrated, the common reset control signal CRS maintains the high voltage level during the blank period B. In an exemplary embodiment, in the blank period B, each of the first clock signal CLK1 and the second clock signal CLK2 maintains a low voltage level.

The common reset control signal CRS is applied to the respective gate electrodes of the sixth switching element Tr6, the seventh switching element Tr7 and the eighth switching element Tr8 provided in the n-th stage STGn. Accordingly, each of the sixth switching element Tr6, the seventh switching element Tr7 and the eighth switching element Tr8 is turned on.

The second off voltage VSS2 is applied to the set node Q of the n-th stage STGn through the turned-on sixth switching element Tr6. Accordingly, the set node Q of the n-th stage STGn is discharged, and the gate output switching element TGO and the carry output switching element TCO connected to the discharged set node Q through the respective gate electrodes are turned off.

The first off voltage VSS1 is applied to the gate output terminal GOT of the n-th stage STGn through the turned-on seventh switching element Tr7. Accordingly, the gate output terminal GOT and the n-th gate line GLn connected thereto are discharged.

The second off voltage VSS2 is applied to the carry output terminal COT of the n-th stage STGn through the turned-on eighth switching element Tr8. Accordingly, the carry output terminal COT of the n-th stage STGn, the set control terminal ST of the (n+1)-th stage STGn+1 and the reset control terminal RT of the (n−1)-th stage STGn−1 are discharged.

The common reset control signal CRS is applied in common to all the stages STG1 to STGi+1 including the n-th stage STGn. Accordingly, all the stages STG1 to STGi+1 in the blank period B operate in the same manner as the n-th stage STGn described above.

Figure 6:
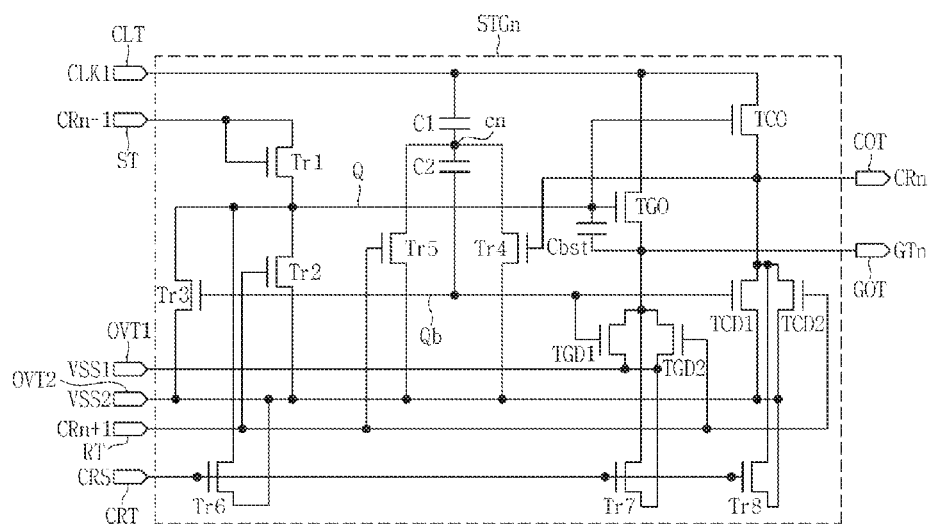
FIG. 6 is a diagram illustrating another exemplary embodiment of the n-th stage of FIG. 2.

FIG. 6 is another diagram illustrating the n-th stage STGn of FIG. 2.

As illustrated in FIG. 6, the n-th stage STGn may include a first switching element Tr1, a second switching element Tr2, a third switching element Tr3, a fourth switching element Tr4, a fifth switching element Try, a sixth switching element Tr6, a seventh switching element Tr7, an eighth switching element Tr8, a gate output switching element TGO, a carry output switching element TCO, a first gate discharge switching element TGD1, a second gate discharge switching element TGD2, a first carry discharge switching element TCD1, a second carry discharge switching element TCD2, a bootstrapping capacitor Cbst, a first capacitor C1 and a second capacitor C2.

Since the first switching element Tr1, the second switching element Tr2, the third switching element Tr3, the sixth switching element Tr6, the seventh switching element Tr7, the eighth switching element Tr8, the gate output switching element TGO, the carry output switching element TCO, the first gate discharge switching element TGD1, the second gate discharge switching element TGD2, the first carry discharge switching element TCD1, the second carry discharge switching element TCD2, the bootstrapping capacitor Cbst, the first capacitor C1 and the second capacitor C2 provided in the n-th stage STGn of FIG. 6 are substantially identical to those illustrated in FIG. 4 above, the components of FIG. 6 will make reference to FIG. 4 and the related description.

The fourth switching element Tr4 of the n-th stage STGn illustrated in FIG. 6 applies a DC voltage to a capacitor node cn of the n-th stage STGn based on a signal applied to a carry output terminal COT of the n-th stage STGn. The DC voltage may be, for example, a second off voltage VSS2. The fourth switching element Tr4 of the n-th stage STGn is turned on or off by the n-th carry signal CRn applied to the carry output terminal COT, and when turned on, the fourth switching element Tr4 electrically connects the capacitor node cn and the second off-voltage input terminal OVT2 of the n-th stage STGn. To this end, the fourth switching element Tr4 includes a gate electrode connected to the carry output terminal COT, and is connected between the capacitor node cn and the second off voltage input terminal OVT2.

The fifth switching element Tr5 of the n-th stage STGn illustrated in FIG. 6 applies a DC voltage to the capacitor node cn of the n-th stage STGn based on a signal applied to a reset control terminal RT of the n-th stage STGn. The DC voltage may be, for example, a second off voltage VSS2. In addition, the reset control signal may be an (n+1)-th carry signal CRn+1 from the (n+1)-th stage STGn+1. The fifth switching element Tr5 of the n-th stage STGn is turned on or turned off by the (n+1)-th carry signal CRn+1 applied to the reset control terminal RT, and when turned on, the fifth switching element Tr5 electrically connects the capacitor node cn and the second off-voltage input terminal OVT2 of the n-th stage STGn. To this end, the fifth switching element Tr5 includes a gate electrode connected to the reset control terminal RT, and is connected between the capacitor node cn and the second off voltage input terminal OVT2.

Figure 7:
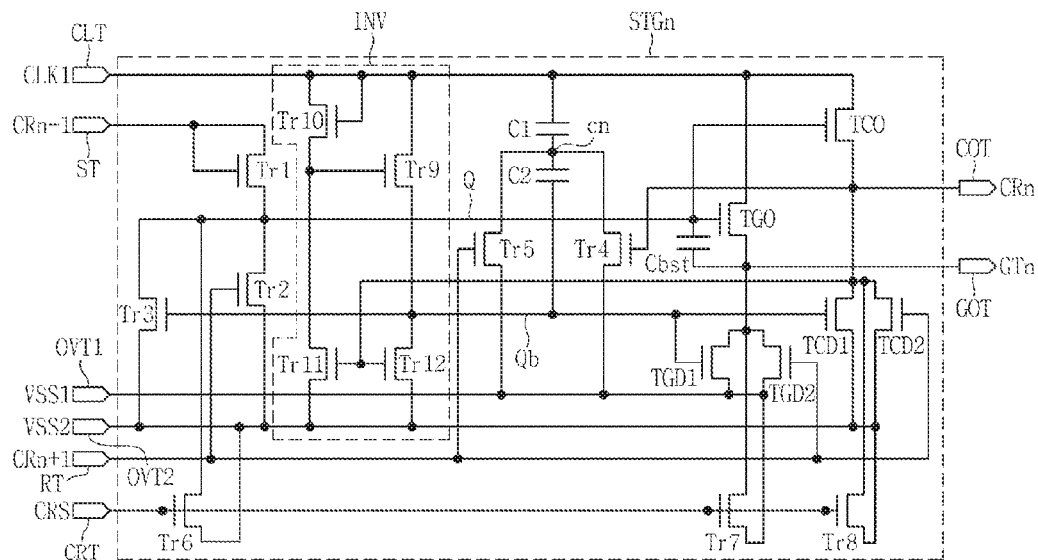
FIG. 7 is a diagram illustrating another exemplary embodiment of the n-th stage of FIG. 2.

FIG. 7 is still another diagram illustrating the n-th stage STGn of FIG. 2.

As illustrated in FIG. 7, the n-th stage STGn may include a first switching element Tr1, a second switching element Tr2, a third switching element Tr3, a fourth switching element Tr4, a fifth switching element Tr5, a sixth switching element Tr6, a seventh switching element Tr7, an eighth switching element Tr8, a ninth switching element Tr9, a tenth switching element Tr10, an eleventh switching element Tr11, a twelfth switching element Tr12, a gate output switching element TGO, a carry output switching element TCO, a first gate discharge switching element TGD1, a second gate discharge switching element TGD2, a first carry discharge switching element TCD1, a second carry discharge switching element TCD2, a bootstrapping capacitor Cbst, a first capacitor C1, a second capacitor C2 and an inverter unit INV.

Since the first switching element Tr1, the second switching element Tr2, the third switching element Tr3, the fourth switching element Tr4, the fifth switching element Tr5, the sixth switching element Tr6, the seventh switching element Tr7, the eighth switching element Tr8, the gate output switching element TGO, the carry output switching element TCO, the first gate discharge switching element TGD1, the second gate discharge switching element TGD2, the first carry discharge switching element TCD1, the second carry discharge switching element TCD2, the bootstrapping capacitor Cbst, the first capacitor C1 and the second capacitor C2 provided in the n-th stage STGn of FIG. 7 are substantially identical to those illustrated in FIG. 4 above, the components of FIG. 7 will make reference to FIG. 4 and the related description.

The inverter unit INV of the n-th stage STGn charges or discharges a reset node Qb of the n-th stage STGn based on a first control signal and a second control signal externally applied thereto.

The first control signal may be a signal applied to a clock input terminal CLT of the n-th stage STGn, that is, a first clock signal CLK1. The second control signal may be a signal applied to a gate output terminal GOT or a carry output terminal COT of the n-th stage STGn. That is, the second control signal may be an n-th gate signal GTn or an n-th carry signal CRn.

The inverter unit INV provided in the n-th stage STGn of FIG. 7 may include the ninth switching element Tr9, the tenth switching element Tr10, the eleventh switching element Tr11 and the twelfth switching element Tr12.

The ninth switching element Tr9 of the n-th stage STGn charges or discharges the reset node Qb of the n-th stage STGn based on a signal applied to a gate electrode of the ninth switching element Tr9. The ninth switching element Tr9 of the n-th stage STGn is turned on or off by the signal applied to the gate electrode of the ninth switching element Tr9, and when turned on, the ninth switching element Tr9 electrically connects the clock input terminal CLT and the reset node Qb of the n-th stage STGn. To this end, the ninth switching element Tr9 includes a gate electrode, and is connected between the clock input terminal CLT and the reset node Qb.

The tenth switching element Tr10 of the nth stage STGn charges the gate electrode of the ninth switching element Tr9 provided in the n-th stage STGn based on the first clock signal CLK1 applied to the clock input terminal CLT of the n-th stage STGn. The tenth switching element Tr10 of the n-th stage STGn is turned on or off by the first clock signal CLK1, and when turned on, the tenth switching element Tr10 electrically connects the clock input terminal CLT and the gate electrode of the ninth switching element Tr9. To this end, the tenth switching element Tr10 includes a gate electrode connected to the clock input terminal CLT, and is connected between the clock input terminal CLT and the gate electrode of the ninth switching element Tr9.

The eleventh switching element Tr11 of the nth stage STGn discharges the gate electrode of the ninth switching element Tr9 based on an n-th carry signal CRn applied to the carry output terminal COT of the n-th stage STGn. The eleventh switching element Tr11 of the n-th stage STGn is turned on or off by the n-th carry signal CRn, and when turned on, the eleventh switching element Tr11 electrically connects the gate electrode of the ninth switching element Tr9 and a second off-voltage input terminal OVT2 of the n-th stage STGn. To this end, the eleventh switching element Tr11 includes a gate electrode connected to the carry output terminal COT, and is connected between the gate electrode of the ninth switching element Tr9 and the second off voltage input terminal OVT2.

Although not illustrated, as an alternative example, the eleventh switching element Tr11 of the n-th stage STGn may be connected to the gate output terminal GOT of the n-th stage STGn instead of the carry output terminal COT of the n-th stage STGn.

As another alternative example, the eleventh switching element Tr11 of the n-th stage STGn may be connected to the first off voltage input terminal OVT1 instead of the second off voltage input terminal OVT2.

The twelfth switching element Tr12 of the n-th stage STGn discharges the reset node Qb of the n-th stage STGn based on the n-th carry signal CRn applied to the carry output terminal COT of the n-th stage STGn. The twelfth switching element Tr12 of the n-th stage STGn is turned on or off by the n-th carry signal CRn, and when turned on, the twelfth switching element Tr12 electrically connects the turned-on reset node Qb and the second off voltage input terminal OVT2. To this end, the twelfth switching element Tr12 includes a gate electrode connected to the carry output terminal COT, and is connected between the reset node Qb and the second off voltage input terminal OVT2.

Although not illustrated, as an alternative example, the twelfth switching element Tr12 of the n-th stage STGn may be connected to the gate output terminal GOT of the n-th stage STGn instead of the carry output terminal COT of the n-th stage STGn when it is necessary.

As another alternative example, the twelfth switching element Tr12 of the n-th stage STGn may be connected to the first off-voltage input terminal OVT1 instead of the second off-voltage input terminal OVT2.

Figure 8:
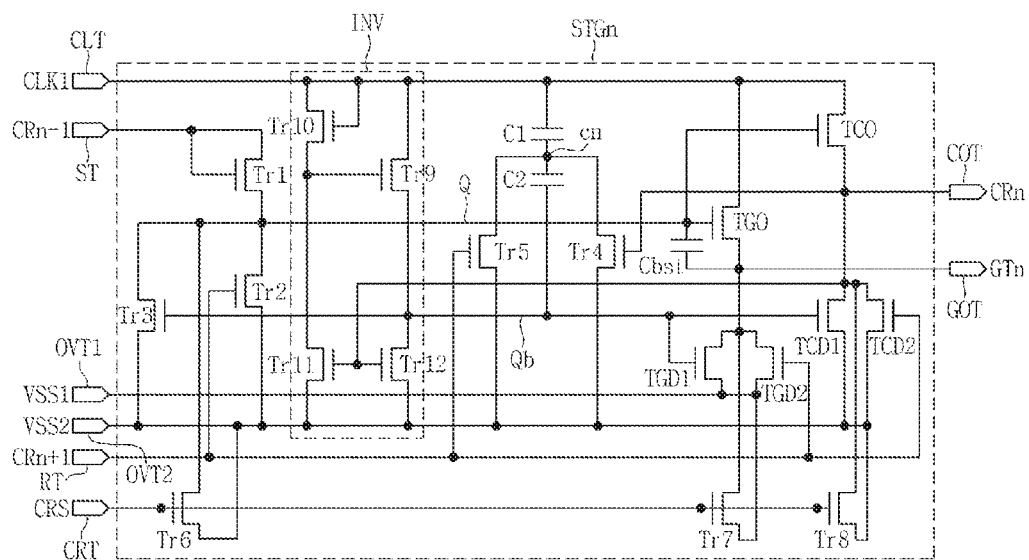
FIG. 8 is a diagram illustrating another exemplary embodiment of the n-th stage of FIG. 2.

FIG. 8 is a diagram illustrating another exemplary embodiment of the n-th stage STGn of FIG. 2.

As illustrated in FIG. 8, the n-th stage STGn may include a first switching element Tr1, a second switching element Tr2, a third switching element Tr1, a fourth switching element Tr4, a fifth switching element Try, a sixth switching element Tr6, a seventh switching element Tr7, an eighth switching element Tr8, a ninth switching element Tr9, a tenth switching element Tr10, an eleventh switching element Tr11, a twelfth switching element Tr12, a gate output switching element TGO, a carry output switching element TCO, a first gate discharge switching element TGD1, a second gate discharge switching element TGD2, a first carry discharge switching element TCD1, a second carry discharge switching element TCD2, a bootstrapping capacitor Cbst, a first capacitor C1, a second capacitor C2 and an inverter unit INV.

Since the first switching element Tr1, the second switching element Tr2, the third switching element Tr3, the sixth switching element Tr6, the seventh switching element Tr7, the eighth switching element Tr8, the gate output switching element TGO, the carry output switching element TCO, the first gate discharge switching element TGD1, the second gate discharge switching element TGD2, the first carry discharge switching element TCD1, the second carry discharge switching element TCD2, the bootstrapping capacitor Cbst, the first capacitor C1 and the second capacitor C2 provided in the n-th stage STGn of FIG. 8 are substantially identical to those illustrated in FIG. 4 above, the components of FIG. 8 will make reference to FIG. 4 and the related description.

Since the fourth switching element Tr4 and the fifth switching element Tr5 provided in the n-th stage STGn of FIG. 8 are substantially identical to those illustrated in FIG. 6 above, the components of FIG. 8 will make reference to FIG. 6 and the related description.

Since the ninth switching element Tr9, the tenth switching element Tr10, the eleventh switching element Tr11 and the twelfth switching element Tr12 provided in the n-th stage STGn of FIG. 8 are substantially identical to those illustrated in FIG. 7 above, the components of FIG. 8 will make reference to FIG. 7 and the related description.

FIGS. 9A, 9B, 9C, 9D, 9E and 9F are diagrams illustrating a method of forming a first capacitor and a second capacitor of FIG. 4.

Figure 9A:
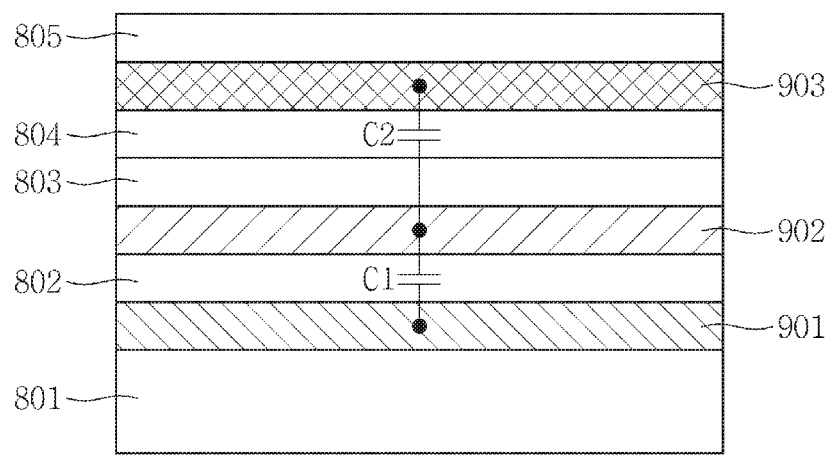
FIGS. 9A, 9B, 9C, 9D, 9E and 9F are diagrams illustrating a method of forming a first capacitor and a second capacitor of FIG. 4.

Referring to FIG. 9A, the display device includes a substrate 801, a first conductive layer 901, a gate insulating layer 802, a second conductive layer 902, an insulating interlayer 803, an organic layer 804, a third conductive layer 903 and a protective layer 805.

The first conductive layer 901, the gate insulating layer 802, the second conductive layer 902, the interlayer insulating layer 803, the organic layer 804, the third conductive layer 903 and the protective layer 805 are sequentially disposed on the substrate 801.

The first conductive layer 901 may include a substantially same material as a material included in a gate electrode of the pixel transistor described above and may be positioned in a substantially same layer as a layer in which the gate electrode of the pixel transistor is disposed.

The second conductive layer 902 may include a substantially same material as a material included in a source electrode and a drain electrode of the pixel transistor described above, and may be positioned in a substantially same layer as a layer in which the source electrode and the drain electrode of the pixel transistor are positioned.

The third conductive layer 903 may include a substantially same material as a material included in a pixel electrode of the pixel transistor described above and may be positioned in a substantially same layer as a layer in which the pixel electrode of the pixel transistor is disposed.

A horizontal electric field may be generated by a data voltage of the pixel electrode and a common voltage of an intermediate common electrode.

As illustrated in FIG. 9A, a first capacitor C1 may include the first conductive layer 901, the second conductive layer 902 overlapping the first conductive layer 901, and the gate insulating layer 802 between the first conductive layer 901 and the second conductive layers 902.

As illustrated in FIG. 9A, a second capacitor C2 may include the second conductive layer 902, the third conductive layer 903 overlapping the second conductive layer 902, and the insulating inlayer 803 and the organic layer 804 between the second conductive layer 902 and the third conductive layers 903. The pixel electrode may be positioned on the protective layer 805 in the display area 105a of the display panel 105 (refer to FIG. 1).

Figure 9B:
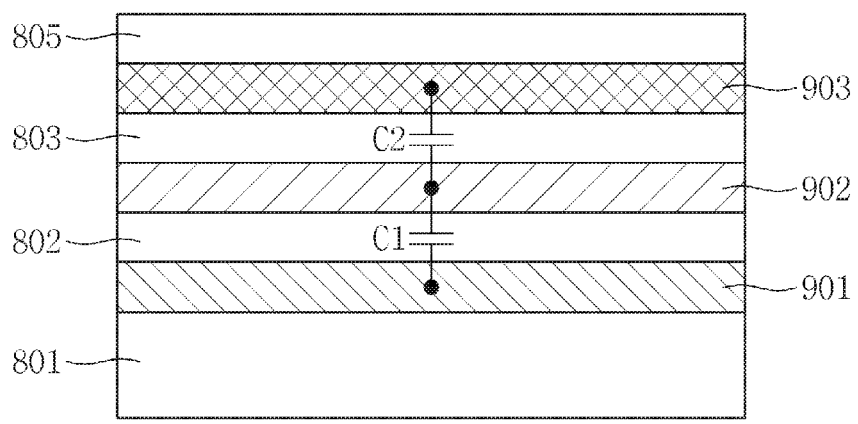

In an alternative exemplary embodiment, as illustrated in FIG. 9B, the display device may include a substrate 801, a first conductive layer 901, a gate insulating layer 802, a second conductive layer 902, an insulating interlayer 803, a third conductive layer 903 and a protective layer 805. A pixel electrode may be positioned on the protective layer 805 in the display area 105a of the display panel 105.

As illustrated in FIG. 9B, a first capacitor C1 may include the first conductive layer 901, the second conductive layer 902 overlapping the first conductive layer 901, and the gate insulating layer 802 between the first conductive layer 901 and the second conductive layers 902.

As illustrated in FIG. 9B, a second capacitor C2 may include the second conductive layer 902, the third conductive layer 903 overlapping the second conductive layer 902, and the insulating inlayer 803 between the second conductive layer 902 and the third conductive layers 903.

Figure 9C:
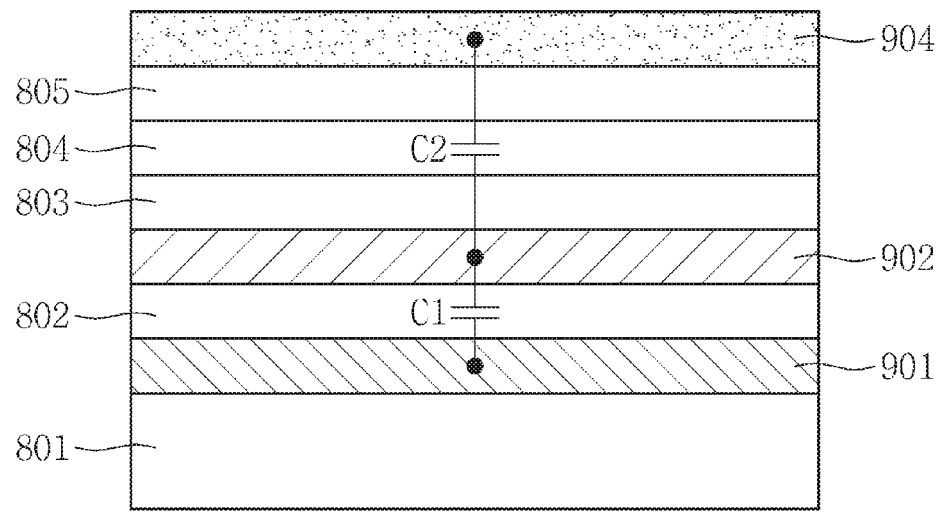

In an alternative exemplary embodiment, as illustrated in FIG. 9C, the display device may include a substrate 801, a first conductive layer 901, a gate insulating layer 802, a second conductive layer 902, an insulating interlayer 803, an organic layer 804, a protective layer 805 and a fourth conductive layer 904. The fourth conductive layer 904 may include a substantially same material as a material included in the pixel electrode, and may be positioned in a substantially same layer as a layer in which the pixel electrode is disposed. The intermediate common electrode described above may be positioned between the organic layer 804 and the protective layer 805 in the display area 105a of the display panel 105.

As illustrated in FIG. 9C, a first capacitor C1 may include the first conductive layer 901, the second conductive layer 902 overlapping the first conductive layer 901, and the gate insulating layer 802 between the first conductive layer 901 and the second conductive layers 902.

As illustrated in FIG. 9C, a second capacitor C2 may include the second conductive layer 902, the fourth conductive layer 904 overlapping the second conductive layer 902, and the insulating inlayer 803, the organic layer 804 and the protective layer 805 between the second conductive layer 902 and the fourth conductive layers 904.

Figure 9D:
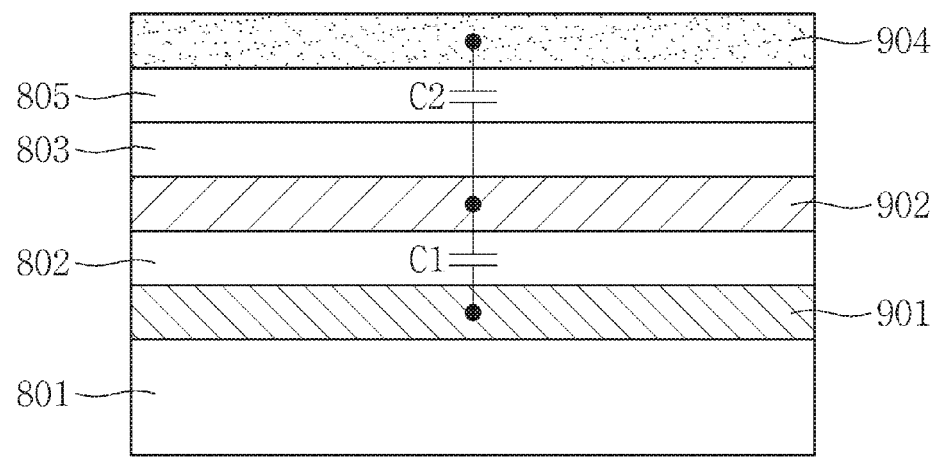

In an alternative exemplary embodiment, as illustrated in FIG. 9D, the display device may include a substrate 801, a first conductive layer 901, a gate insulating layer 802, a second conductive layer 902, an insulating interlayer 803, a protective layer 805 and a fourth conductive layer 904. The intermediate common electrode described above may be positioned between the insulating interlayer 803 and the protective layer 805 in the display area 105a of the display panel 105.

As illustrated in FIG. 9D, a first capacitor C1 may include the first conductive layer 901, the second conductive layer 902 overlapping the first conductive layer 901, and the gate insulating layer 802 between the first conductive layer 901 and the second conductive layers 902.

As illustrated in FIG. 9D, a second capacitor C2 may include the second conductive layer 902, the fourth conductive layer 904 overlapping the second conductive layer 902, and the insulating inlayer 803 and the protective layer 805 between the second conductive layer 902 and the fourth conductive layers 904.

Figure 9E:
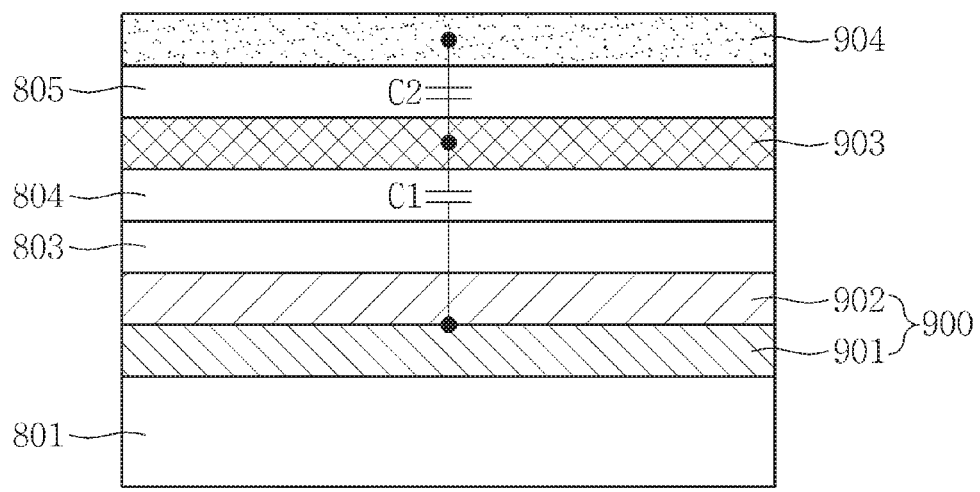

In an alternative exemplary embodiment, as illustrated in FIG. 9E, the display device may include a substrate 801, a first conductive layer 901, a second conductive layer 902, an insulating interlayer 803, an organic layer 804, a third conductive layer 903, a protective layer 805 and a fourth conductive layer 904. The first conductive layer 901 and the second conductive layer 902 are connected to each other through a contact hole of the gate insulating layer (not shown). Herein, the first conductive layer 901 and the second conductive layer 902 connected through the contact hole are defined as a double layer 900.

As illustrated in FIG. 9E, a first capacitor C1 includes the double layer 900, the third conductive layer 903 overlapping the double layer 900, the insulating interlayer 803 and the organic layer 804 between the double layer 900 and the third conductive layer 903.

As illustrated in FIG. 9E, a second capacitor C2 may include a third conductive layer 903, a fourth conductive layer 904 overlapping the third conductive layer 903, and the protective layer 805 between the third conductive layer 903 and the fourth conductive layers 904.

Figure 9F:
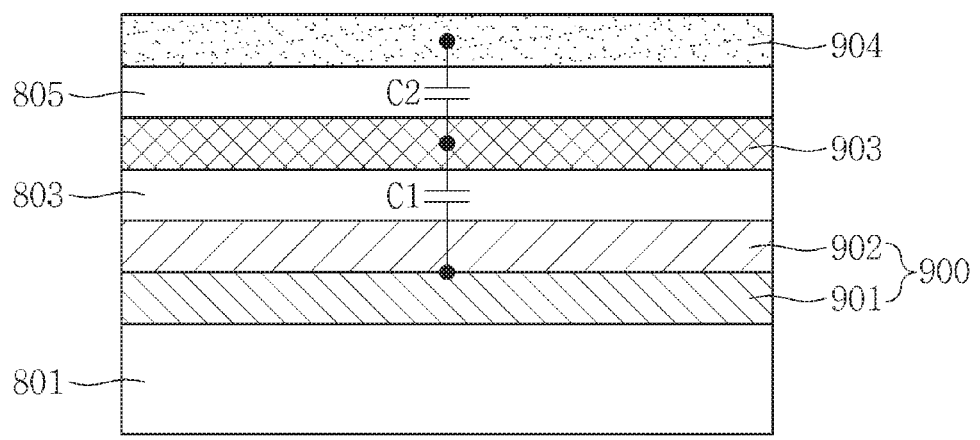

In an alternative exemplary embodiment, as illustrated in FIG. 9F, the display device may include a substrate 801, a first conductive layer 901, a second conductive layer 902, an insulating interlayer 803, a third conductive layer 903, a protective layer 805 and a fourth conductive layer 904. The first conductive layer 901 and the second conductive layer 902 are connected to each other through a contact hole of the gate insulating layer (not shown). Herein, the first conductive layer 901 and the second conductive layer 902 connected through the contact hole are defined as a double layer 900.

As illustrated in FIG. 9F, a first capacitor C1 includes the double layer 900, the third conductive layer 903 overlapping the double layer 900, and the insulating interlayer 803 between the double layer 900 and the third conductive layer 903.

As illustrated in FIG. 9F, a second capacitor C2 may include a third conductive layer 903, a fourth conductive layer 904 overlapping the third conductive layer 903, and the protective layer 805 between the third conductive layer 903 and the fourth conductive layers 904.

The above-described structure of FIGS. 9A, 9B, 9C, 9D, 9E and 9F may be applied to the first and second capacitors C1 and C2 of FIGS. 6, 7 and 8 described above.

Figure 10:
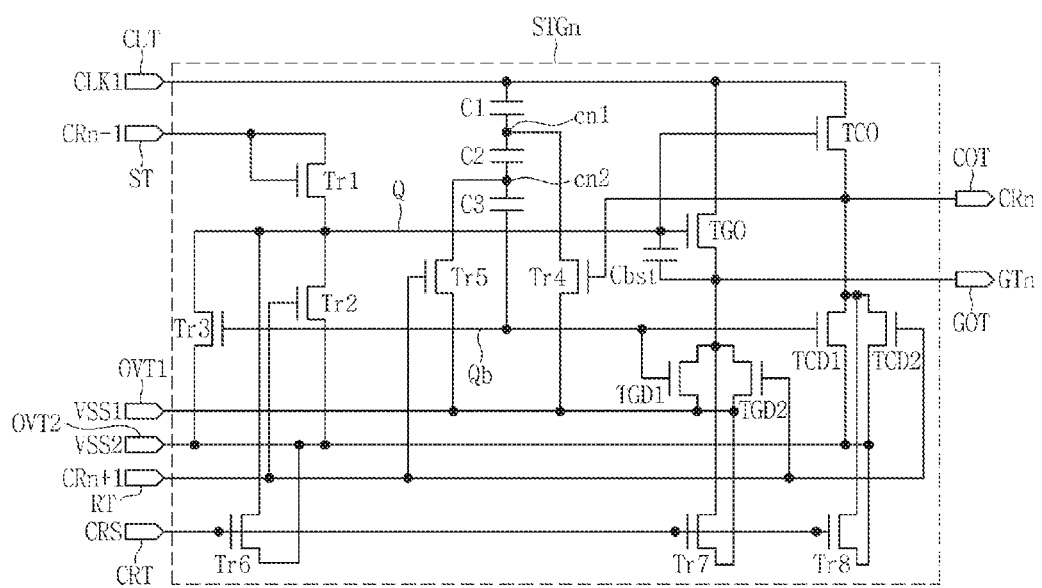
FIG. 10 is a diagram illustrating another exemplary embodiment of the n-th stage of FIG. 2.

FIG. 10 is a diagram illustrating another exemplary embodiment of the n-th stage STGn of FIG. 2.

As illustrated in FIG. 10, the n-th stage STGn may include a first switching element Tr1, a second switching element Tr2, a third switching element Tr3, a fourth switching element Tr4, a fifth switching element Try, a sixth switching element Tr6, a seventh switching element Tr7, an eighth switching element Tr8, a gate output switching element TGO, a carry output switching element TCO, a first gate discharge switching element TGD1, a second gate discharge switching element TGD2, a first carry discharge switching element TCD1, a second carry discharge switching element TCD2, a bootstrapping capacitor Cbst, a first capacitor C1, a second capacitor C2 and a third capacitor C3.

Since the first switching element Tr1, the second switching element Tr2, the third switching element Tr3, the fourth switching element Tr4, the fifth switching element Tr5, the sixth switching element Tr6, the seventh switching element Tr7, the eighth switching element Tr8, the gate output switching element TGO, the carry output switching element TCO, the first gate discharge switching element TGD1, the second gate discharge switching element TGD2, the first carry discharge switching element TCD1, the second carry discharge switching element TCD2, the bootstrapping capacitor Cbst, the first capacitor C1 and the second capacitor C2 provided in the n-th stage STGn of FIG. 10 are substantially identical to those illustrated in FIG. 4 above, the components of FIG. 10 will make reference to FIG. 4 and the related description.

The third capacitor C3 of the n-th stage STGn is connected between the second capacitor C2 and the reset node Qb.

A node between a plurality of capacitors to which the fourth switching element Tr4 is connected may be different from a node between a plurality of capacitors to which the fifth switching element Tr5 is connected. In an exemplary embodiment, as illustrated in FIG. 10, when a node to which the first capacitor C1 and the second capacitor C2 are connected is defined as a first capacitor node cn1 and a node to which the second capacitor C2 and the third capacitor C3 are connected is defined as a second capacitor node cn2, the fourth switching element Tr4 may be connected to the first capacitor node cn1 and the fifth switching element Tr5 may be connected to the second capacitor node cn2, for example.

Although not illustrated, as an alternative example, the fourth switching element Tr4 and the fifth switching element Tr5 may be connected to a same capacitor node. In an exemplary embodiment, a drain electrode (or a source electrode) of the fourth switching element Tr4 and a drain electrode (or a source electrode) of the fifth switching element Tr5 may each be connected to the second capacitor node cn2, for example.

In addition, two or more capacitors may be connected between a clock input terminal CLT and a reset node Qb of the n-th stage STGn. When the fourth and fifth switching elements Tr4 and Tr5 are in a turned-off state, two or more capacitors are connected in series between the clock input terminal CLT and the reset node Qb.

Figure 11:
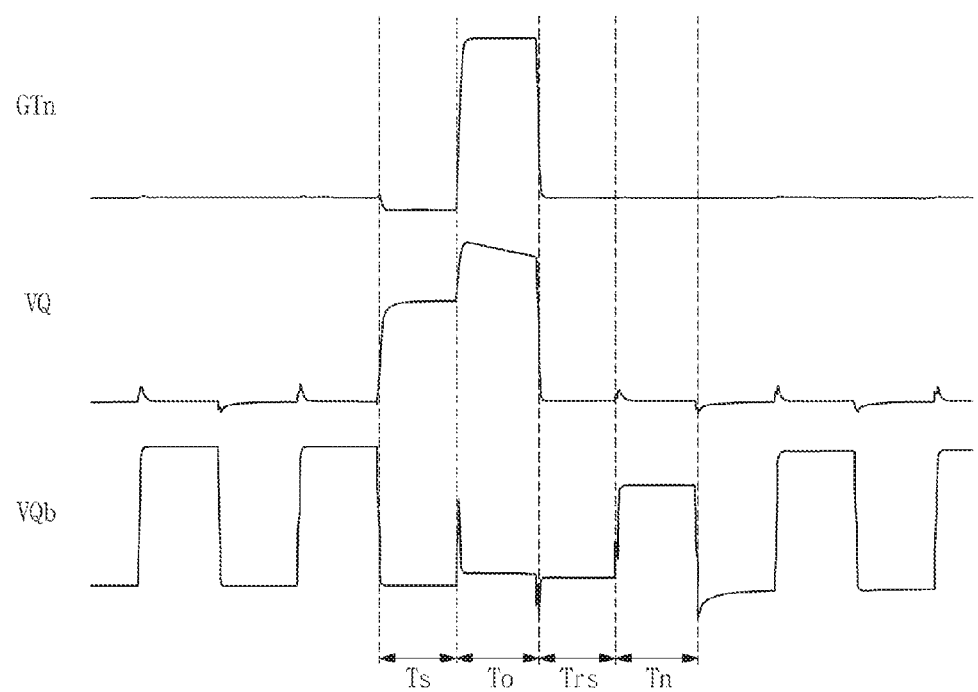
FIG. 11 is a diagram illustrating simulation results of the n-th stage of FIG. 4.

FIG. 11 is a diagram illustrating simulation results of the n-th stage STGn of FIG. 4.

As illustrated in FIG. 11, the n-th gate signal GTn from the n-th stage STGn, a voltage VQ (hereinafter, "a set node voltage") of the set node Q of the n-th stage STGn and a voltage VQb (hereinafter, "a reset node voltage") of the reset node Qb of the n-th stage STGn have a normal magnitude.

Particularly, although the first clock signal CLK1 has a high voltage level in the output period To, the reset node voltage VQb may maintain a normal low voltage level in the output period To. This is because, in the output period To, the capacitor node cn may maintain the DC voltage by the above-described fourth switching element Tr4.

Since the reset node voltage VQb may maintain the normal low voltage level during the output period To in such a manner, the set node voltage VQ may be normally bootstrapped during the output period To.

In addition, since the set node voltage VQ is normally bootstrapped during the output period To, the n-th gate signal GTn may be output in a normal magnitude during the output period To. Although not illustrated in FIG. 11, the n-th carry signal CRn may also be output in a normal magnitude during the output period To.

In an exemplary embodiment, as illustrated in FIG. 11, as the reset node voltage VQb is overshot for a significantly short time at a start point of the output period To and the reset node voltage VQb is undershot for a significantly short time at an end point of the output period To, the overshot voltage is generated when the first clock signal CLK1 transits from a low voltage level to a high voltage level, and the undershoot voltage occurs when the clock signal CLK1 transits from a high voltage level to a low voltage level. The overshot voltage and the undershot voltage may be eliminated by the first clock signal CLK1, having a low voltage level, periodically applied to the reset node Qb.

Figure 12A:
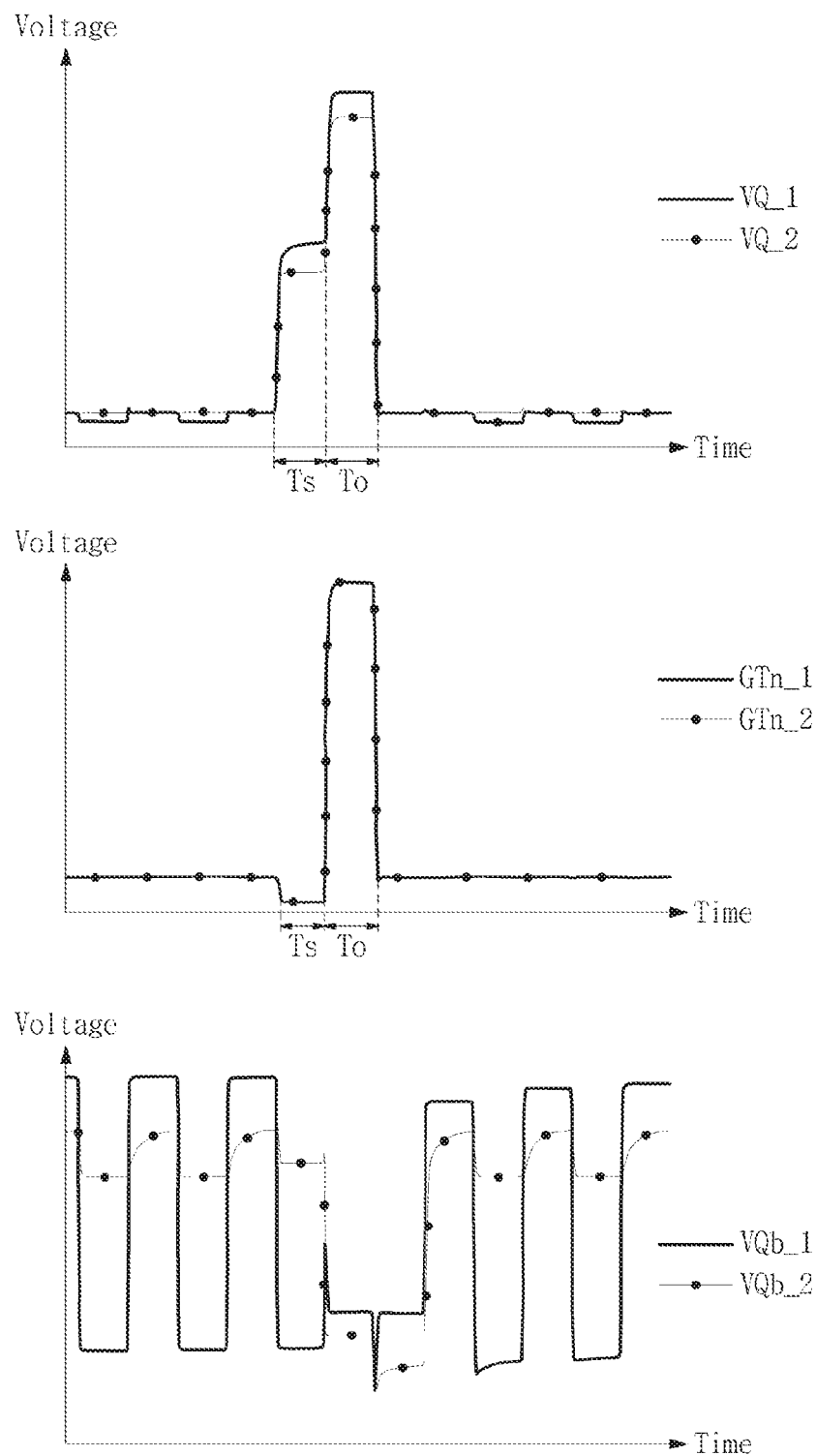
FIGS. 12A and 12B are diagrams for comparing simulation results of an exemplary embodiment of the n-th stage having the structure of FIG. 4 and simulation results of the conventional n-th stage.
Figure 12B:
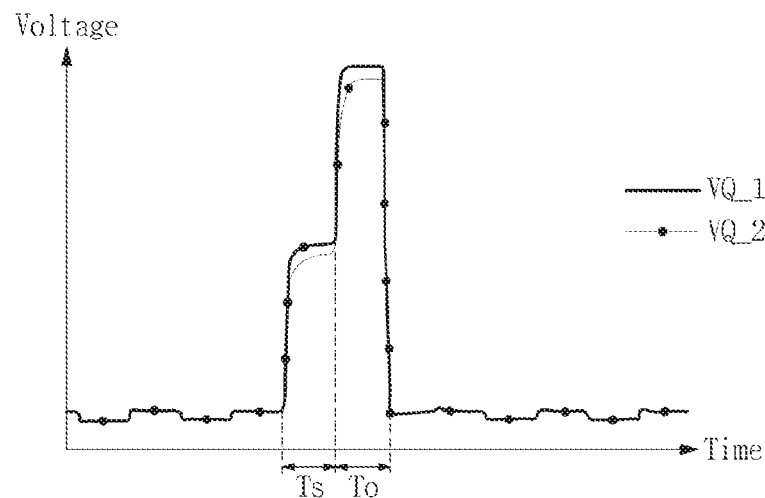
Figure 12B:
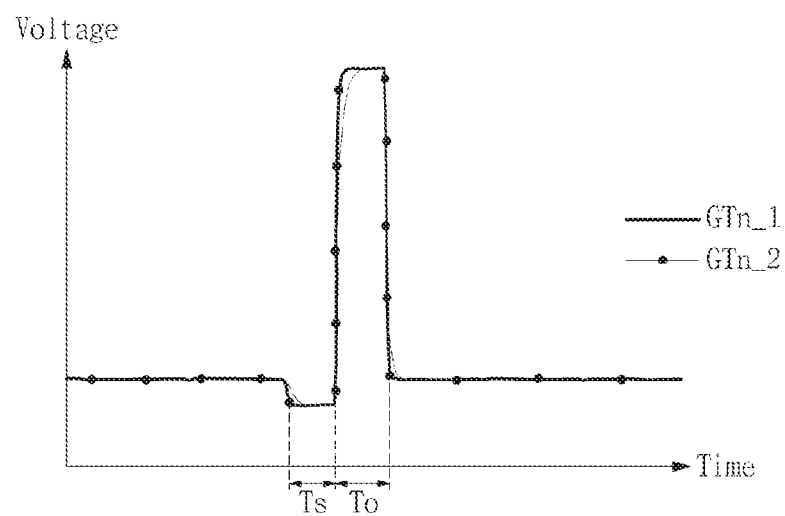
Figure 12B:
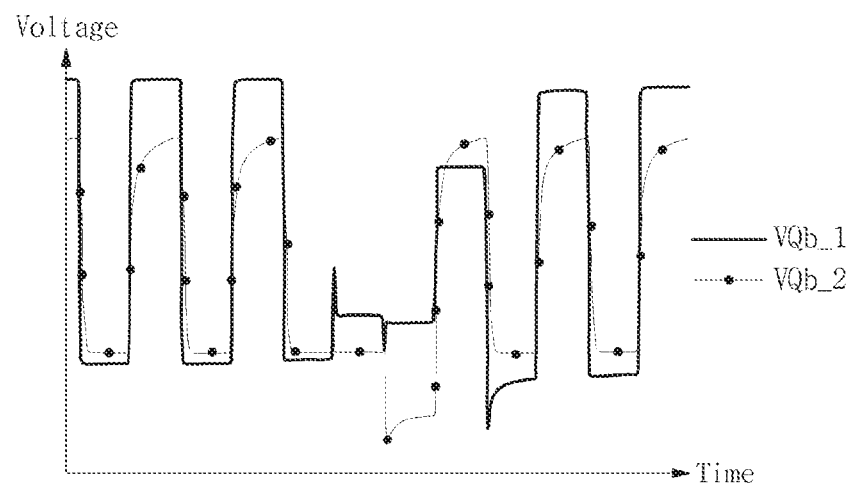

FIGS. 12A and 12B are diagrams for comparing simulation results of the n-th stage STGn of an exemplary embodiment having the structure of FIG. 4 and simulation results of the conventional n-th stage.

The diagrams of FIG. 12A show waveforms of the set node voltage, the gate signal and the reset node voltage respectively measured from the n-th stage STGn of an exemplary embodiment and the conventional n-th stage after they are driven for about 500 hours at a temperature of about 60 degrees Celsius (° C.), for example.

As illustrated in FIG. 12A, in the set period Ts and the output period To, a set node voltage VQ_1 of an exemplary embodiment is higher than a conventional set node voltage VQ_2. In addition, in a part of the other periods except for the set period Ts and the output period To, the set node voltage VQ_1 of an exemplary embodiment is less than the conventional set node voltage VQ_2. As such, the set node voltage VQ_1 of an exemplary embodiment is more stable in all periods than the conventional set node voltage VQ_2.

In addition, as illustrated in FIG. 12A, in the set period Ts and the output period To, the gate signal GTn_1 of an exemplary embodiment and the conventional gate signal GTn_2 have a substantially equal magnitude.

In addition, as illustrated in FIG. 12A, a reset node voltage VQb_1 of an exemplary embodiment has a low voltage level substantially less than that of a conventional reset node voltage VQb_2. Accordingly, the reset node voltage VQb_1 of an exemplary embodiment is more stable than the conventional set node voltage VQb_2.

The diagrams of FIG. 12B show waveforms of the set node voltage, the gate signal and the reset node voltage respectively measured from the n-th stage STGn of an exemplary embodiment and the conventional n-th stage after they are driven for about 500 hours at a temperature of about 0° C., for example.

As illustrated in FIG. 12B, in the set period Ts and the output period To, a set node voltage VQ_1 of an exemplary embodiment is higher than a conventional set node voltage VQ_2. In addition, in a part of the other periods except for the set period Ts and the output period To, the set node voltage VQ_1 of an exemplary embodiment is less than the conventional set node voltage VQ_2. As such, the set node voltage VQ_1 of an exemplary embodiment is more stable in all periods than the conventional set node voltage VQ_2.

In addition, as illustrated in FIG. 12B, a gate signal GTn_1 of an exemplary embodiment and a conventional gate signal GTn_2 have a substantially equal level in the set period Ts and the output period To. However, the gate signal GTn_1 of an exemplary embodiment has a more stable form than the conventional gate signal GTn_2.

In addition, as illustrated in FIG. 12B, a reset node voltage VQb_1 of an exemplary embodiment has a low voltage level substantially less than that of a conventional reset node voltage VQb_2. Accordingly, the reset node voltage VQb_1 of an exemplary embodiment is more stable than the conventional set node voltage VQb_2.

Figure 13:
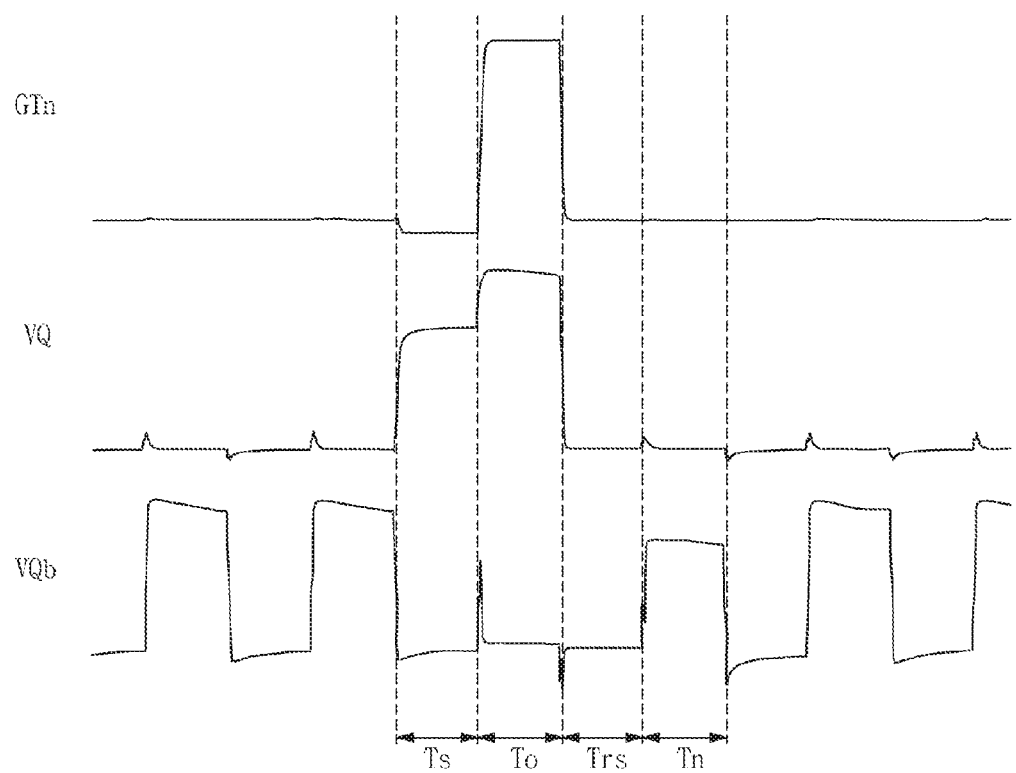
FIG. 13 is a diagram illustrating simulation results of the n-th stage of FIG. 6.

FIG. 13 is a diagram illustrating simulation results of the n-th stage STGn of FIG. 6.

As illustrated in FIG. 13, the n-th gate signal GTn from the n-th stage STGn, the voltage VQ of the set node Q of the n-th stage STGn and the voltage VQb of the reset node Qb of the n-th stage STGn have a normal magnitude.

Particularly, although the first clock signal CLK1 has a high voltage level in the output period To, the voltage of the reset node Qb may maintain a normal low voltage level in the output period To. This is because, in the output period To, the capacitor node cn may maintain a DC voltage by the aforementioned fourth switching element Tr4.

Since the voltage of the reset node Qb may maintain the normal low voltage level in the output period To in such a manner, the voltage of the set node Q may be normally bootstrapped during the output period To.

In addition, since the set node Q is normally bootstrapped during the output period To, the n-th gate signal GTn may be output in a normal magnitude during the output period To. Although not illustrated in FIG. 13, the n-th carry signal CRn may also be output in a normal magnitude during the output period To.

In an exemplary embodiment, as illustrated in FIG. 13, as voltage of the reset node Qb is overshot for a significantly short time at a start point of the output period To and the voltage of the reset node Qb is undershot for a significantly short time at an end point of the output period To, the overshot voltage is generated when the first clock signal CLK1 transits from a low voltage level to a high voltage level, and the undershot voltage is generated when the clock signal CLK1 transits from a high voltage level to a low voltage level. The overshot voltage and the undershot voltage may be eliminated by the first clock signal CLK1, having a low voltage level, periodically applied to the reset node Qb.

Figure 14A:
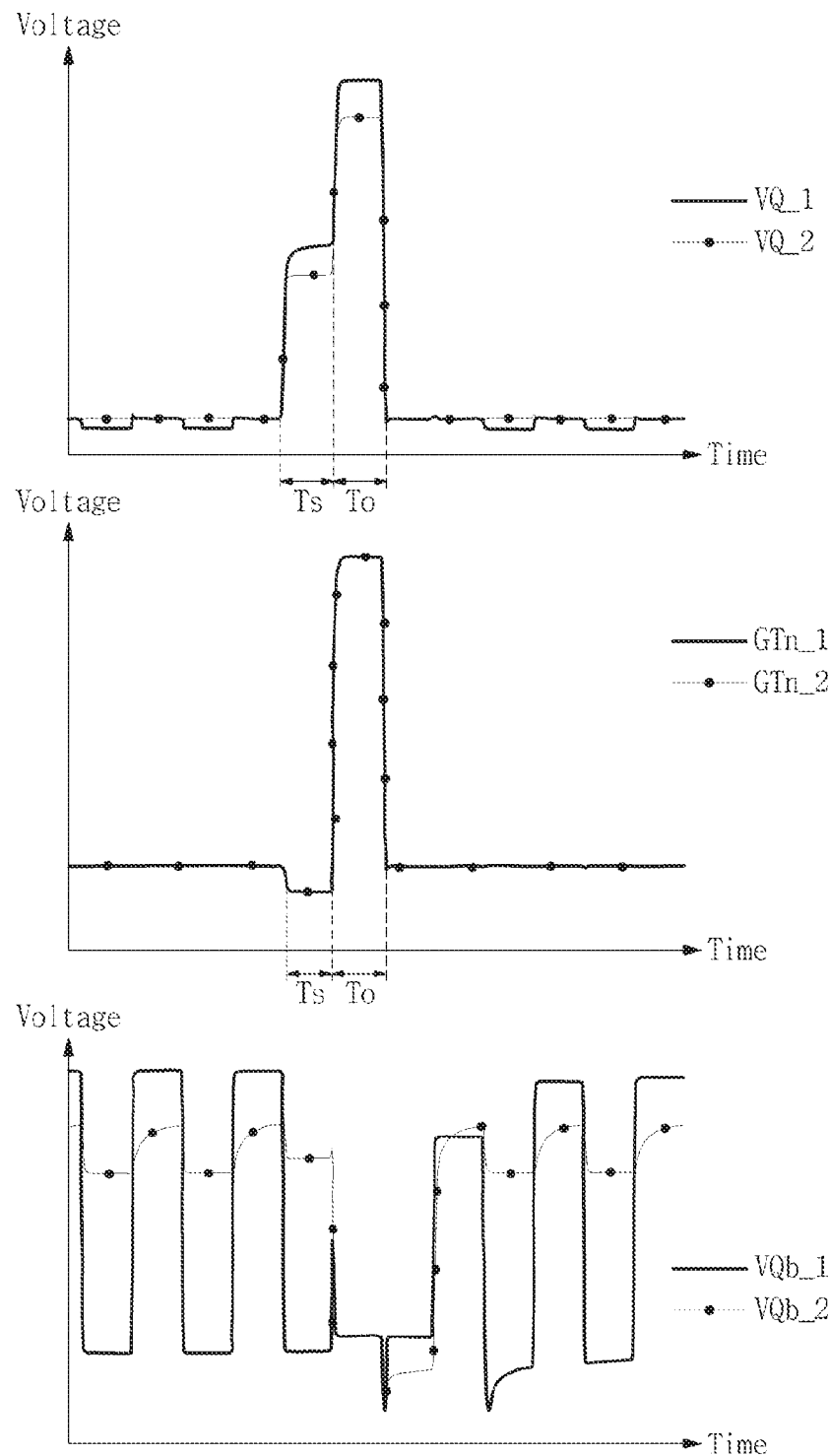
FIGS. 14A and 14B are diagrams for comparing simulation results of an exemplary embodiment of the n-th stage having the structure of FIG. 6 with simulation results of a conventional n-th stage.
Figure 14B:
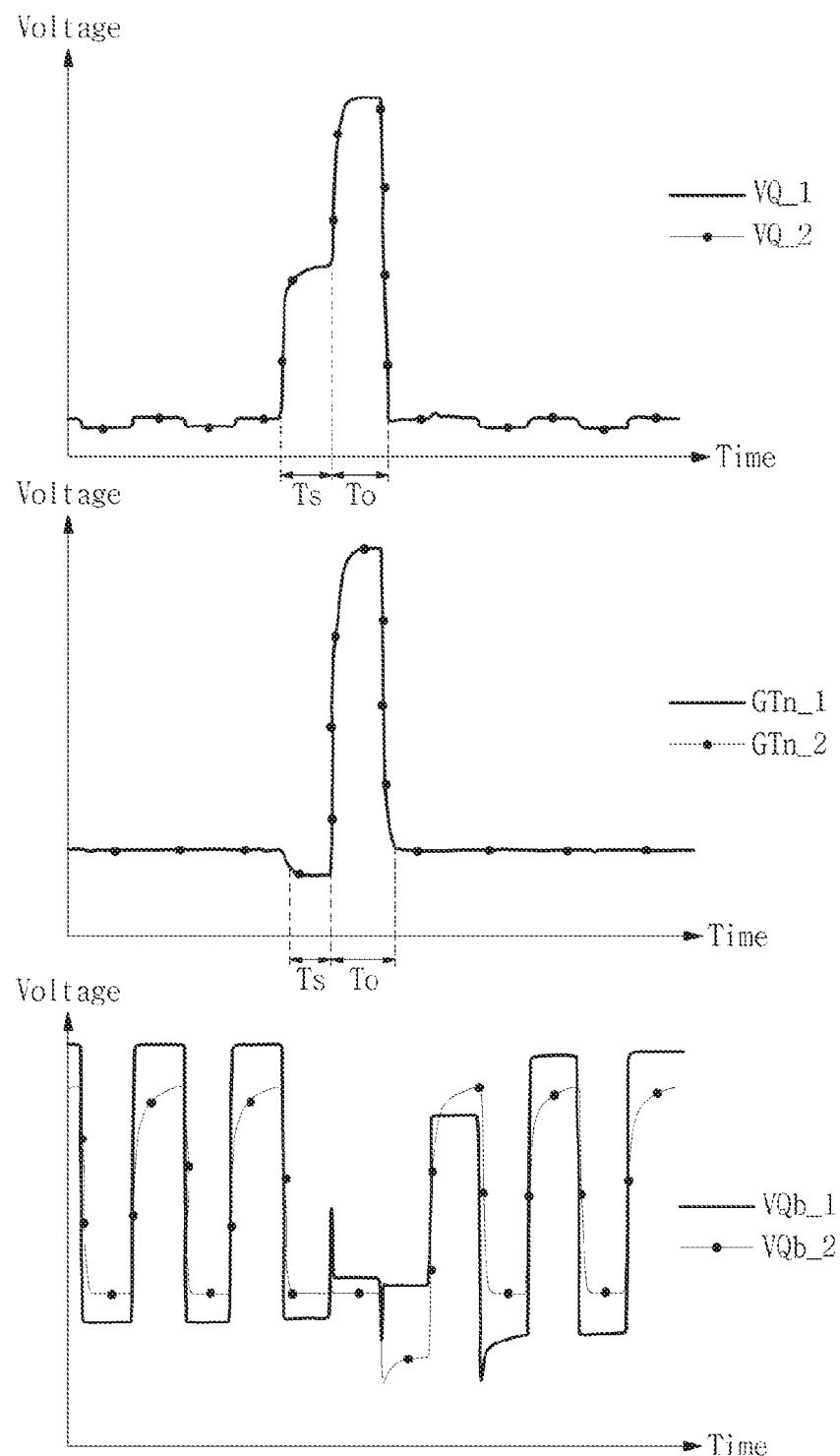

FIGS. 14A and 14B are diagrams for comparing simulation results of the n-th stage STGn of an exemplary embodiment having the structure of FIG. 6 with simulation results of a conventional n-th stage.

The diagrams of FIG. 14A show waveforms of the set node voltage, the gate signal and the reset node voltage respectively measured from the n-th stage STGn of an exemplary embodiment and the conventional n-th stage after they are driven for about 500 hours at a temperature of about 60° C., for example.

As illustrated in FIG. 14A, in the set period Ts and the output period To, a set node voltage VQ_1 of an exemplary embodiment is higher than a conventional set node voltage VQ_2. In addition, in a part of the other periods except for the set period Ts and the output period To, the set node voltage VQ_1 of an exemplary embodiment is less than the conventional set node voltage VQ_2. As such, the set node voltage VQ_1 of an exemplary embodiment is more stable in all periods than the conventional set node voltage VQ_2.

In addition, as illustrated in FIG. 14A, in the set period Ts and the output period To, a gate signal GTn_1 of an exemplary embodiment and a conventional gate signal GTn_2 have a substantially equal magnitude.

In addition, as illustrated in FIG. 14A, a reset node voltage VQb_1 of an exemplary embodiment has a low voltage level less than that of a conventional reset node voltage VQb_2. Accordingly, the reset node voltage VQb_1 of an exemplary embodiment is more stable than the conventional set node voltage VQb_2.

The diagrams of FIG. 14B show waveforms of the set node voltage, the gate signal and the reset node voltage respectively measured from the n-th stage STGn of an exemplary embodiment and the conventional n-th stage after they are driven for about 500 hours at a temperature of about 0° C., for example.

As illustrated in FIG. 14B, in the set period Ts and the output period To, a set node voltage VQ_1 of an exemplary embodiment is substantially equal to a conventional set node voltage VQ_2. However, in a part of the other periods except for the set period Ts and the output period To, the set node voltage VQ_1 of an exemplary embodiment is less than the conventional set node voltage VQ_2. As such, the set node voltage VQ_1 of an exemplary embodiment is more stable in most periods than the conventional set node voltage VQ_2.

In addition, as illustrated in FIG. 14B, a gate signal GTn_1 of an exemplary embodiment and a conventional gate signal GTn_2 have a substantially equal level in the set period Ts and the output period To.

In addition, as illustrated in FIG. 14B, a reset node voltage VQb_1 of an exemplary embodiment has a low voltage level less than that of a conventional reset node voltage VQb_2. Accordingly, the reset node voltage VQb_1 of an exemplary embodiment is more stable than the conventional set node voltage VQb_2.

As set forth hereinabove, the gate driver according to one or more exemplary embodiments may provide the following effects.

First, a multi-output may be substantially prevented as the set node of the stage is electrically discharged, periodically. That is, the output of the stage may be stabilized.

Second, the set node may be periodically discharged through a fairly simple discharge structure including two capacitors and one or two switching elements controlling their nodes, so the size of the stage may be reduced. Accordingly, the occupied area of the gate driver in the display panel is reduced, and the thickness of the bezel of the display device may be reduced.

While the invention has been illustrated and described with reference to the exemplary embodiments thereof, it will be apparent to those of ordinary skill in the art that various changes in form and detail may be made thereto without departing from the spirit and scope of the invention.

What is claimed is:

1. A gate driver of a display device, the gate driver comprising:
a stage which drives a gate line of a display panel and comprises:
a first switching element connected between one of a high voltage input terminal and a set control terminal of the stage and a set node of the stage, and comprising a gate electrode connected to the set control terminal of the stage;
a second switching element connected between the set node and an off voltage input terminal of the stage, and comprising a gate electrode connected to a reset control terminal of the stage;
a third switching element connected between the set node and the off voltage input terminal, and comprising a gate electrode connected to a reset node of the stage;
an output switching element connected between an output terminal of the stage and a clock input terminal of the stage, and comprising a gate electrode connected to the set node;
a plurality of capacitors connected between the clock input terminal and the reset node; and
a fourth switching element connected between a node between the plurality of capacitors and a direct current voltage input terminal to which a direct current voltage is applied, and comprising a gate electrode connected to the output terminal; and
a fifth switching element connected between the direct current voltage input terminal and a node between the plurality of capacitors, and comprising a gate electrode connected to the reset control terminal.

2. The gate driver of the display device as claimed in claim 1, wherein the direct current voltage input terminal and the off voltage input terminal are substantially the same.

3. The gate driver of the display device as claimed in claim 1, wherein the node between the plurality of capacitors to which the fourth switching element is connected is substantially the same as the node between the plurality of capacitors to which the fifth switching element is connected.

4. The gate driver of the display device as claimed in claim 1, wherein the node between the plurality of capacitors to which the fourth switching element is connected is different from the node between the plurality of capacitors to which the fifth switching element is connected.

5. The gate driver of the display device as claimed in claim 1, wherein the output terminal comprises:
a gate output terminal through which a gate signal of the stage is output; and
a carry output terminal through which a carry signal of the stage is output.

6. The gate driver of the display device as claimed in claim 5, wherein the gate electrode of the fourth switching element is connected to either the gate output terminal or the carry output terminal.

7. The gate driver of the display device as claimed in claim 1, wherein the off voltage input terminal comprises:
a first off voltage input terminal to which a first low voltage is applied; and
a second off voltage input terminal to which a second low voltage is applied, the second low voltage being less than the first low voltage,
wherein the direct current voltage input terminal is one of the first off voltage input terminal and the second off voltage input terminal, and the direct current voltage is one of the first low voltage and the second low voltage.

8. The gate driver of the display device as claimed in claim 7, wherein the fourth switching element is connected to either the first off voltage input terminal or the second off voltage input terminal.

9. The gate driver of the display device as claimed in claim 5, wherein the output switching element comprises:
a gate output switching element connected between the clock input terminal and the gate output terminal which comprises a gate electrode connected to the set node; and
a carry output switching element connected between the clock input terminal and the carry output terminal which comprises a gate electrode connected to the set node.

10. The gate driver of the display device as claimed in claim 5, wherein the stage further comprises an output discharge switching element connected between the output terminal and the off voltage input terminal, and comprising a gate electrode connected to the reset node.

11. The gate driver of the display device as claimed in claim 10, wherein the off voltage input terminal comprises:
a first off voltage input terminal to which a first low voltage is applied; and
a second off voltage input terminal to which a second low voltage is applied, the second low voltage being less than the first low voltage, wherein the direct current voltage input terminal is one of the first off voltage input terminal and the second off voltage input terminal, and the direct current voltage is one of the first low voltage and the second low voltage, the output discharge switching element comprises:
- a first gate discharge switching element connected between the gate output terminal and the first off voltage input terminal, and comprising a gate electrode connected to the reset node; and
- a first carry discharge switching element connected between the carry output terminal and the second off voltage input terminal, and comprising a gate electrode connected to the reset node.

12. The gate driver of the display device as claimed in claim 11, wherein the output discharge switching element further comprises:
- a second gate discharge switching element connected between the gate output terminal and the first off voltage input terminal, and comprising a gate electrode connected to the reset control terminal; and
- a second carry discharge switching element connected between the carry output terminal and the second off voltage input terminal, and comprising a gate electrode connected to the reset control terminal.

13. The gate driver of the display device as claimed in claim 5, wherein the stage further comprises at least one of:
- a sixth switching element connected between the set node and the off voltage input terminal, and comprising a gate electrode connected to a common reset control terminal of the stage;
- a seventh switching element connected between the gate output terminal and the off voltage input terminal, and comprising a gate electrode connected to the common reset control terminal; and
- an eighth switching element connected between the carry output terminal and the off voltage input terminal, and comprising a gate electrode connected to the common reset control terminal.

14. The gate driver of the display device as claimed in claim 5, wherein the stage further comprises an inverter unit controlling a signal of the reset node based on a signal of the clock input terminal and a signal of the output terminal.

15. The gate driver of the display device as claimed in claim 14, wherein the inverter unit comprises:
- a ninth switching element connected between the clock input terminal and the reset node, the ninth switching element comprising a gate electrode;
- a tenth switching element connected between the clock input terminal and the gate electrode of the ninth switching element, the tenth switching element comprising a gate electrode connected to the clock input terminal;
- an eleventh switching element connected between the gate electrode of the ninth switching element and the off voltage input terminal, the eleventh switching element comprising a gate electrode connected to the output terminal; and
- a twelfth switching element connected between the reset node and the off voltage input terminal, the twelfth switching element comprising a gate electrode connected to the output terminal.

16. The gate driver of the display device as claimed in claim 1, further comprising a previous stage outputting at least one of a gate signal and a carry signal prior to the stage during one frame period and applying one of the gate signal and the carry signal to the set control terminal of the stage.

17. The gate driver of the display device as claimed in claim 1, further comprising a subsequent stage outputting at least one of a gate signal and a carry signal subsequent to the stage during one frame period and applying one of the gate signal and the carry signal to the reset control terminal of the stage.

18. A gate driver of a display device, the gate driver comprising:
- a stage which drives a gate line of a display panel and comprises:
  - a first switching element connected between one of a high voltage input terminal and a set control terminal of the stage and a set node of the stage, and comprising a gate electrode connected to the set control terminal of the stage;
  - a second switching element connected between the set node and an off voltage input terminal of the stage, and comprising a gate electrode connected to a reset control terminal of the stage;
  - a third switching element connected between the set node and the off voltage input terminal, and comprising a gate electrode connected to a reset node of the stage;
  - an output switching element connected between an output terminal of the stage and a clock input terminal of the stage, and comprising a gate electrode connected to the set node;
  - a plurality of capacitors connected between the clock input terminal and the reset node;
  - a fourth switching element connected between a node between the plurality of capacitors and a direct current voltage input terminal to which a direct current voltage is applied, and comprising a gate electrode connected to the output terminal,
- wherein the output terminal comprises:
  - a gate output terminal through which a gate signal of the stage is output; and
  - a carry output terminal through which a carry signal of the stage is output,
- wherein the stage further comprises an inverter unit controlling a signal of the reset node based on a signal of the clock input terminal and a signal of the output terminal,
- wherein the inverter unit comprises:
  - a ninth switching element connected between the clock input terminal and the reset node, the ninth switching element comprising a gate electrode;
  - a tenth switching element connected between the clock input terminal and the gate electrode of the ninth switching element, the tenth switching element comprising a gate electrode connected to the clock input terminal;
  - an eleventh switching element connected between the gate electrode of the ninth switching element and the off voltage input terminal, the eleventh switching element comprising a gate electrode connected to the output terminal; and
- a twelfth switching element connected between the reset node and the off voltage input terminal, the twelfth switching element comprising a gate electrode connected to the output terminal.

\* \* \* \* \*